(12) United States Patent
Nakano et al.

(10) Patent No.: US 7,733,713 B2
(45) Date of Patent: Jun. 8, 2010

(54) NON-VOLATILE SEMICONDUCTOR STORAGE DEVICE

(75) Inventors: Hiroaki Nakano, Yokohama (JP); Toshimasa Namekawa, Ota-ku (JP); Hiroshi Ito, Yokohama (JP); Osamu Wada, Yokohama (JP); Atsushi Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 442 days.

(21) Appl. No.: 11/872,281

(22) Filed: Oct. 15, 2007

(65) Prior Publication Data
US 2008/0094898 A1 Apr. 24, 2008

(30) Foreign Application Priority Data
Oct. 16, 2006 (JP) ............................ 2006-281651

(51) Int. Cl.
*G11C 7/00* (2006.01)
(52) U.S. Cl. ............................ 365/189.12; 365/185.09; 365/189.14; 365/189.18; 365/189.05; 365/221; 365/225.7; 365/239; 365/240
(58) Field of Classification Search ............ 365/189.12, 365/185.09, 96, 189.14, 189.18, 189.05, 365/221, 225.7, 239, 240
See application file for complete search history.

(56) References Cited

U.S. PATENT DOCUMENTS

| | | | | |
|---|---|---|---|---|
| 6,804,156 B2* | 10/2004 | Ito | ............................. | 365/201 |
| 7,266,025 B2* | 9/2007 | Nagai et al. | ................. | 365/200 |
| 2004/0066684 A1* | 4/2004 | Ito | ............................. | 365/201 |
| 2004/0165467 A1* | 8/2004 | Sasaki et al. | ............. | 365/225.7 |
| 2007/0070693 A1 | 3/2007 | Nakano et al. | | |
| 2008/0016427 A1 | 1/2008 | Namekawa et al. | | |
| 2010/0011266 A1* | 1/2010 | Kurjanowicz | ............... | 714/735 |

OTHER PUBLICATIONS

Ito et al, Pure CMOS One-Time Programmable Memory Using Gate-Ox Anti-Fuse, Proc. of the IEEE 2004 Custom Integrated Circuits Conference, pp. 469-472.

* cited by examiner

*Primary Examiner*—Hoai V Ho
*Assistant Examiner*—Fernando N Hidalgo
(74) *Attorney, Agent, or Firm*—Turocy & Watson, LLP

(57) ABSTRACT

A memory cell array includes a plurality of non-volatile semiconductor memory elements, each memory element storing data in a non-volatile manner. A shift register stores data read from the semiconductor memory element and sequentially transfers the data outside, the shift register also stores data transferred from outside and stores the data in the semiconductor memory element. A syndrome generation circuit is connected to an output terminal of the shift register, the syndrome generation circuit generating syndrome of data output from the output terminal. An error-correction circuit uses the data and the syndrome to correct an error of the data.

13 Claims, 16 Drawing Sheets

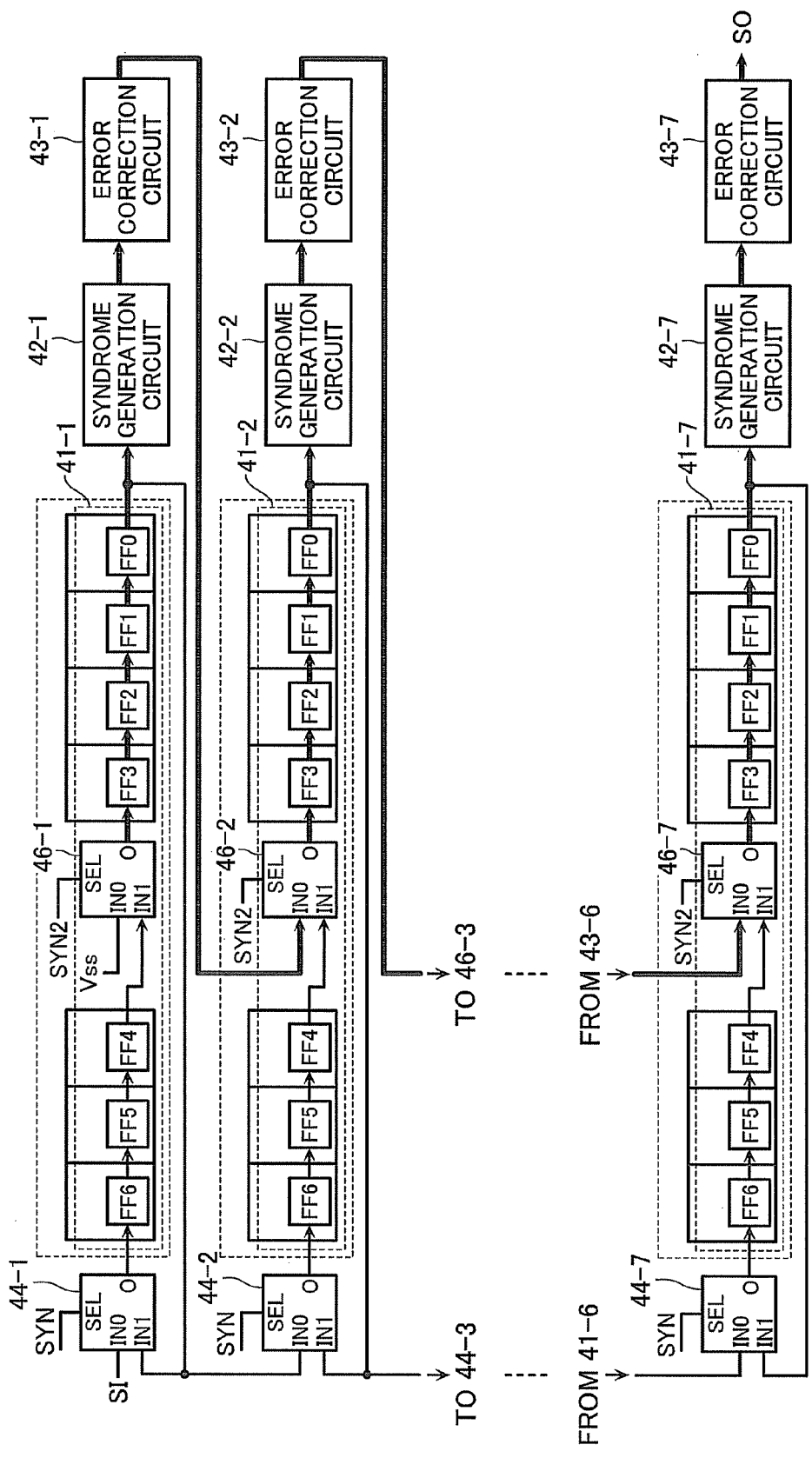

NON-VOLATILE SEMICONDUCTOR STORAGE DEVICE

CROSS REFERENCE TO RELATED APPLICATIONS

This application is based on and claims the benefit of priority from prior Japanese Patent Application No. 2006-281651, filed on Oct. 16, 2006 the entire contents of which are incorporated herein by reference.

BACKGROUND OF THE INVENTION

1. Field of the Invention

The present invention relates to a non-volatile semiconductor storage device.

2. Description of the Related Art

Some semiconductor integrated circuits with a memory such as DRAM or SRAM and a logic circuit are required to store initial setting information in a non-volatile manner, such as recovery information on a defect memory cell and circuit setting information. To store the information, the semiconductor integrated circuit includes a non-volatile semiconductor storage device including a fuse element (see, for example, JP 2005-116003). One proposed non-volatile semiconductor storage device includes an insulating-layer destruction semiconductor memory element (hereinafter referred to as an e-fuse element). The e-fuse element stores information with a high voltage applied to the device to destruct an insulating layer, the high voltage being greater than the maximum rating of the device.

The non-volatile semiconductor storage device stores the initial setting information at a test stage in a manufacturing process. The storage device is requested to maintain the information for a long time after shipment. Depending on a fuse manufacturing condition and a programming condition, change with time after programming may destruct data of the storage device. The device is thus requested to have very high reliabilities.

Depending on the specifications of the non-volatile semiconductor storage device, it is hard to rescue a defect cell. A single bit fault may thus be a critical defect of the storage device.

SUMMARY OF THE INVENTION

A non-volatile semiconductor storage device according to an aspect of the present invention includes: a memory cell array including a plurality of non-volatile semiconductor memory elements, each memory element storing data in a non-volatile manner; a shift register storing data read from the semiconductor memory element and sequentially transferring the data outside, the shift register also storing data transferred from outside and storing the data in the semiconductor memory element; a syndrome generation circuit connected to an output terminal of the shift register, the syndrome generation circuit generating syndrome of data output from the output terminal; and an error-correction circuit using the data and the syndrome to correct an error of the data.

A non-volatile semiconductor storage device according to another aspect of the present invention includes: a memory cell array including a plurality of non-volatile semiconductor memory elements, each memory element storing data in a non-volatile manner; a shift register storing data read from the semiconductor memory element and sequentially transferring the data outside, the shift register also storing data transferred from outside and storing the data in the semiconductor memory element; a syndrome generation circuit connected to an output terminal of the shift register, the syndrome generation circuit generating syndrome of data output from the output terminal; and an error-correction circuit using the data and the syndrome to correct an error of the data, wherein the shift register includes m pieces of data registers connected in series to store m-bit data, and when the syndrome generation circuit generates the syndrome, the m-bit data is cycled in the shift register and is returned to the original data register.

A non-volatile semiconductor storage device according to another aspect of the present invention includes: a memory cell array including a plurality of non-volatile semiconductor memory elements, each memory element storing data in a non-volatile manner; a shift register storing data read from the semiconductor memory element and sequentially transferring the data outside, the shift register also storing data transferred from outside and storing the data in the semiconductor memory element; a syndrome generation circuit configured by incorporating an exclusive logic OR circuit in the shift register to generate syndrome of data stored in the shift register; and an error-correction circuit using the data and the syndrome to correct an error of the data.

BRIEF DESCRIPTION OF THE DRAWINGS

FIG. 14C illustrates an operation of a non-volatile semiconductor storage device of a fifth embodiment.

DETAILED DESCRIPTION OF THE EMBODIMENTS

With reference to the accompanying drawings, embodiments of the present invention will now be described in detail below.

The following embodiments show examples where a semiconductor memory element in a non-volatile semiconductor storage device is the so-called e-fuse element. The present invention is not, however, limited thereto, and may be applied, to a variety of non-volatile memory cells such as a laser fuse element and a mask ROM.

With reference to the accompanying drawings, a description is first given of examples (a first example and a second example) of the non-volatile semiconductor storage device including the e-fuse element to which this embodiment may be applied, and a description is then given of non-volatile semiconductor storage devices according to the embodiments of the present invention.

FIRST EXAMPLE

Figure 1:
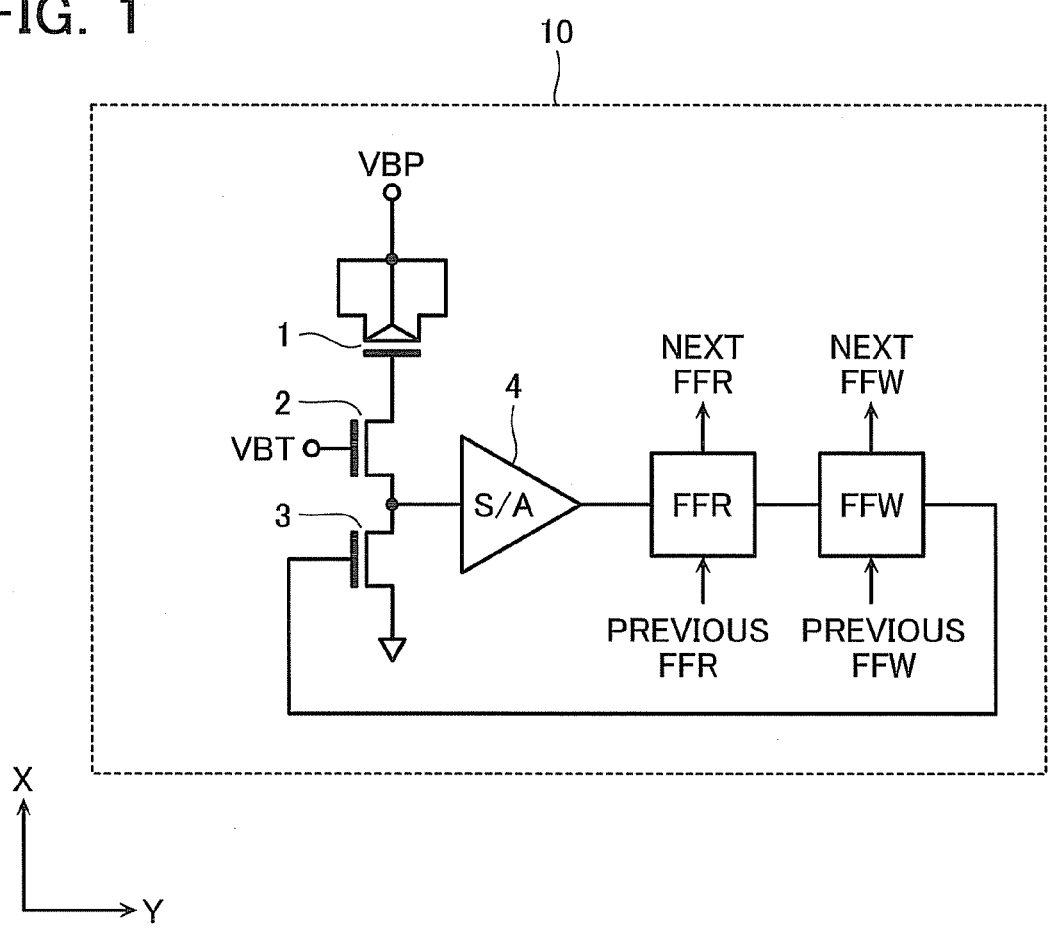
FIG. 1 illustrates a first example of a non-volatile semiconductor storage device using an e-fuse element.
Figure 2:
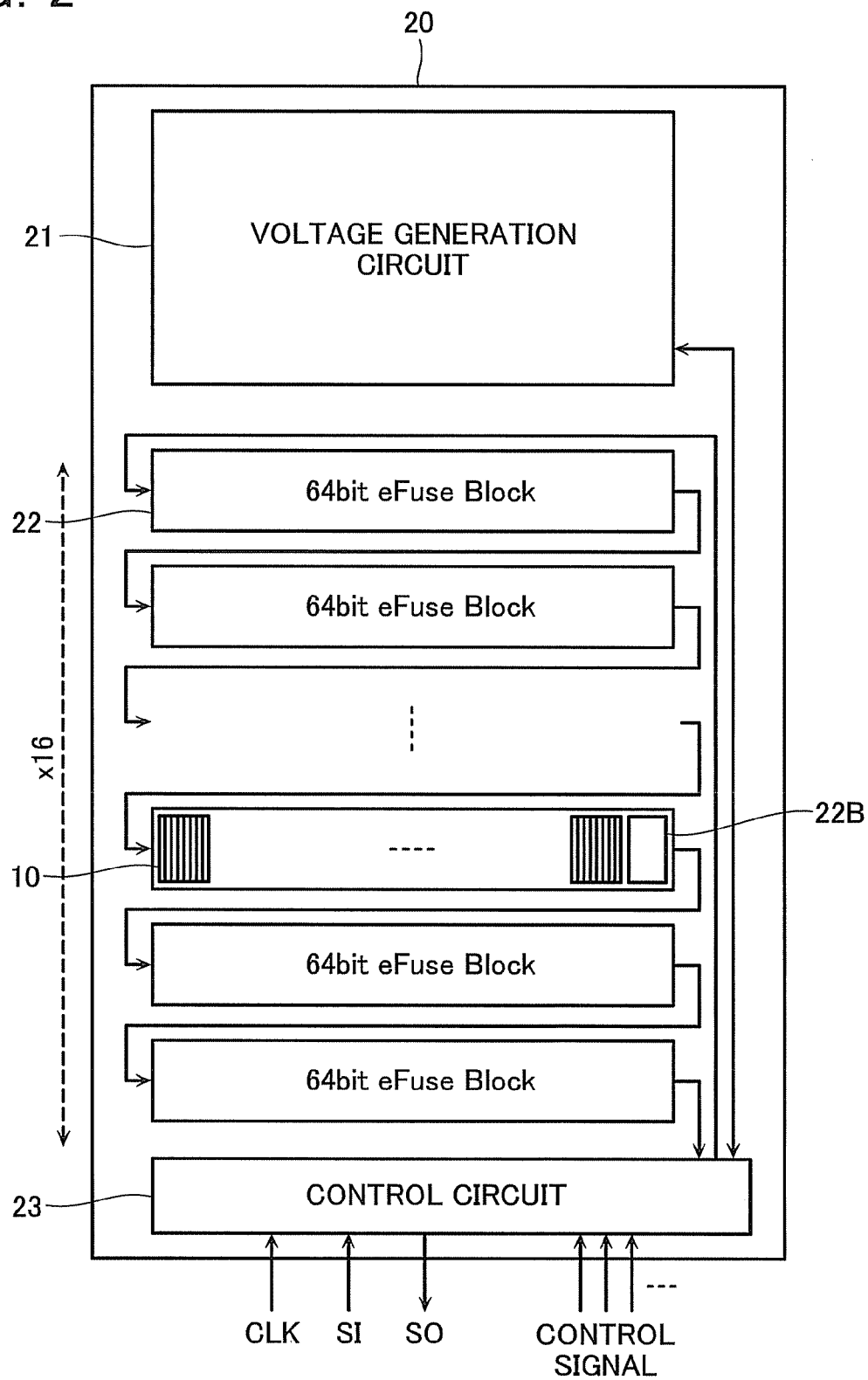
FIG. 2 illustrates a first example of a non-volatile semiconductor storage device using an e-fuse element.

Referring to FIGS. 1 and 2, a first example of the non-volatile semiconductor storage device using the e-fuse element is described below. Referring to FIG. 1, an example configuration of the e-fuse memory cell 10 in the first example is described. The memory cell 10 includes an e-fuse element (a semiconductor memory element) 1, a barrier transistor 2, a selection transistor 3, a sense amplifier 4, and data registers FFR and FFW.

The e-fuse element 1 includes a p-channel MOS transistor. The p-channel transistor has its substrate, source, and drain, all of which are shorted and may be applied with a write voltage VBP. The p-channel transistor has its gate to which a drain of an n-channel transistor as the barrier transistor 2 is connected.

The barrier transistor 2 serves to reduce an effect of a high voltage during programming to the periphery circuits such as the sense amplifier 4. The barrier transistor 2 has its gate applied with a voltage VBT during writing. The voltage VBT also relates to a current control during writing. A voltage VBT–Vt (Vt is the threshold voltage of the barrier transistor 2) is thus preferably as large as possible as far as it may be applied to the sense amplifier without any problems.

The barrier transistor 2 has its source to which the drain of an n channel MOS transistor included in the selection transistor 3 is connected. The n channel MOS transistor has its source grounded.

The sense amplifier 4 has an input terminal connected to the connection node between the barrier transistor 2 and the selection transistor 3. The sense amplifier 4 senses and amplifies a signal at the connection node.

The signal amplified by the sense amplifier 4 is stored as data in the data register FFR. The plural memory cells 10 are disposed in the X direction in FIG. 1. The plural data registers FFR are thus connected in series in the X direction, thereby providing a shift register. Data to be stored in the memory cell 10 is held in the data register FFR, then transferred sequentially in the shift register according to the clock signal, and is output externally.

The data register FFW is used to incorporate externally data to be written to the e-fuse element 1 and temporarily hold the data. When the data register FFW stores data "1," the selection transistor 3 is ON. The barrier transistor 2 may then be rendered conductive, thereby destructing the e-fuse element 1 to write data "1." When the data register FFW stores data "0," the selection transistor 3 is OFF. The e-fuse element 1 is thus not destructed, thereby holding data "0" in the memory cell 10.

FIG. 2 shows an example configuration of the fuse macro 20 including a plurality of memory cells 10 in FIG. 1 in the first example. The memory cells 10 are integrated to form the fuse macro 20. The fuse macro 20 in FIG. 2 includes a voltage generation circuit 21, an e-fuse block 22, and a control circuit 23.

The e-fuse block 22 includes, for example, 64 memory cells 10 and a control circuit 22B. In this example, a plurality of e-fuse blocks 22, are connected in series to form a part of the fuse macro 20. In the first example shown in FIG. 2, 16 e-fuse blocks 22 are connected in series to form a part of a 64×16=1024 bit fuse macro. This is merely an example. The number of memory cells in the e-fuse block 22 and the total number of memory cells may be changed to any value as necessary.

The 64 memory cells 10 each include the data registers FFW and FFR. The registers FFW and FFR are connected in series, thus providing a shift register. According to a clock pulse CLK, the register may shift the held data to the output terminal bit by bit, thus outputting data of the least significant bit through an output terminal SO.

The voltage generation circuit 21 supplies to the e-fuse block 22 a voltage (such as VBP or VBT) necessary to write or read data, or the like.

In synchronism with the clock signal CLK, data is written to or read from the control circuit 23 as follows. Data is written to the circuit 23 by allowing the circuit 23 to serially receive data to be written through a data input terminal SI. Data is read from the circuit 23 by allowing the circuit 23 to serially output data through the data output terminal SO. The control circuit 23 also receives other signals such as various control signals. The received data is transferred sequentially from the forefront e-fuse block 22 and is written to each memory cell 10.

SECOND EXAMPLE

Figure 3:
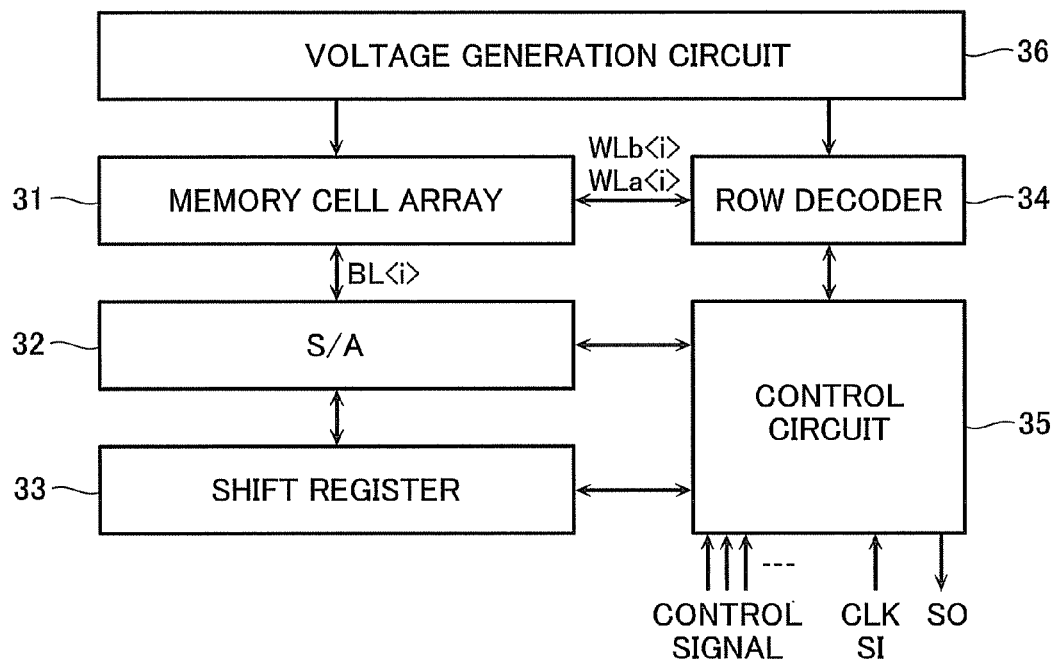
FIG. 3 illustrates a second example of a non-volatile semiconductor storage device using an e-fuse element.
Figure 4:
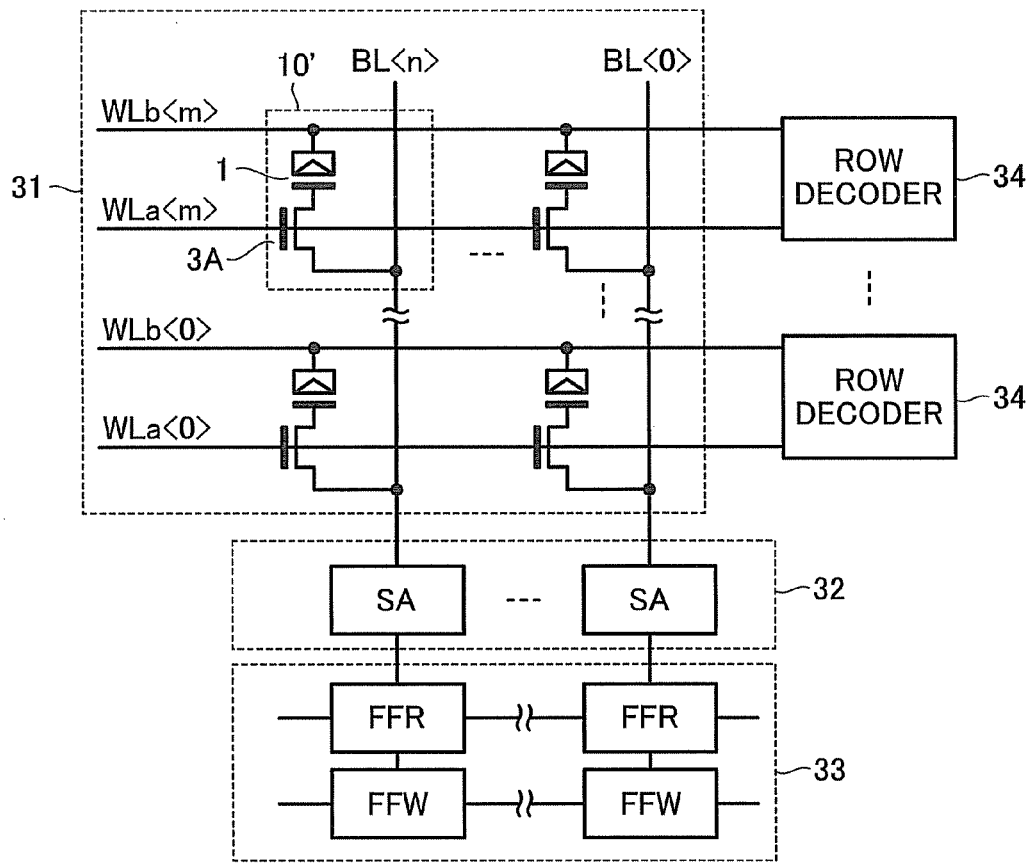
FIG. 4 illustrates a second example of a non-volatile semiconductor storage device using an e-fuse element.

Referring to FIGS. 3 and 4, a second example of the non-volatile semiconductor storage device using the e-fuse element is described below. The first example shows an advantage that each memory cell 10 includes the sense amplifier 4 and the data registers FFR and FFW, so a stable operation may be easily ensured over a wide range of conditions. Each memory cell 10 including the sense amplifier 4 and the data registers FFR and FFW increases, however, the size of the cell 10. In contrast, the second example allows the sense amplifier and the like to be shared by a plurality of memory cells, thereby reducing the cell size.

FIG. 3 is a block diagram of the entire configuration of the non-volatile semiconductor storage device in the second example. Specifically, the non-volatile semiconductor storage device in this example includes a memory cell array 31, a sense amplifier 32, a shift register 33, a row decoder 34, a control circuit 35, and a voltage generation circuit 36.

Referring to FIG. 4, the memory cell array 31 includes a plurality of e-fuse elements 1 arranged in a matrix.

Specifically, the memory cell array 31 includes a plurality of pairs of word-lines WLa <i> and WLb <i> and a plurality of bit-lines BL <i>. At the intersections between the pairs and the bit lines, a memory cell 10' including the e-fuse element 1 is formed. The word-line WLa <i> connects to the gate of a selection transistor 3A. The word-line WLb <i> connects to one end of the e-fuse element to supply write and read voltages.

The selection transistor 3A has one end connected to the other end of the e-fuse element 1. The transistor 3A has the other end connected to the bit-line BL <i>. The sense amplifier 32 resides not for each memory cell 10' but for each bit-line BL <i>. Similar to the first example, the shift register 33 includes the data registers FFR and FFW connected in series. The registers FFR and FFW are provided for each sense amplifier 32.

The control circuit 35 outputs control signals that control the sense amplifier 32, the shift register 33, and the row decoder 34. The voltage generation circuit 36 supplies various voltages for reading and writing data.

Thus, two examples of the non-volatile semiconductor device using the e-fuse element are described. Such the non-volatile semiconductor devices are often used to store information for rescuing defect cells in other semiconductor memory devices such as DRAM and SRAM, various circuit setting information, and chip-identification information. Specifically, such the devices are programmed at a test stage in a manufacturing process, and the devices should maintain the programmed state for a long time after shipment. In some fuse-manufacturing conditions and programming conditions, change with time after the programming may destruct data of the devices. The devices are thus required to have very high reliabilities.

The non-volatile semiconductor storage devices including the e-fuse element in the memory device are often operated to transfer data stored in the e-fuse element almost automatically at the time of turn-on. In this case, it is thus very difficult to rescue a defect element cell. Even a single bit fault may be a fatal defect of the storage device. The yield of the non-volatile semiconductor storage device including the e-fuse element may thus control the yield of the entire memory device product. In this embodiment, therefore, the non-volatile semiconductor storage device using the shift register to read data is added with an error correction function to solve the above issues, as described below.

First Embodiment

Figure 5:
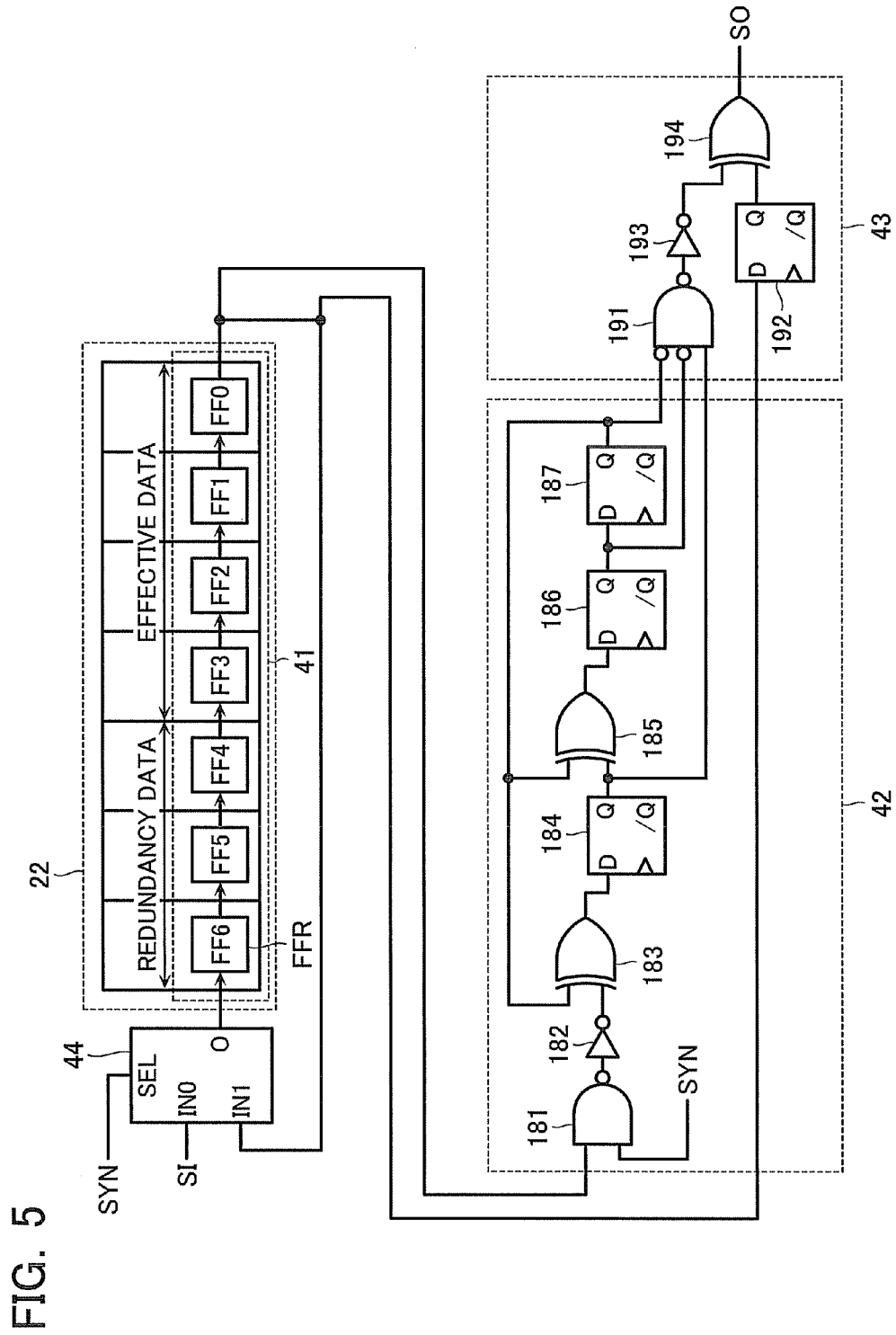
FIG. 5 illustrates a non-volatile semiconductor storage device according to a first embodiment of the present invention.

Referring to FIG. 5, a non-volatile semiconductor storage device having an error correction function according to a first embodiment of the present invention is described below. The non-volatile semiconductor storage device in the first embodiment is based on the non-volatile semiconductor storage device in the first example. Note that this embodiment uses, as an error correction code, a (7, 4) cyclic code, but the present invention is not limited thereto.

The non-volatile semiconductor storage device in this embodiment comprises the non-volatile semiconductor storage device of the first example, a syndrome generation circuit 42, an error-correction circuit 43, and a selector circuit 44. Note that the shift register 41 shown in FIG. 5 includes a plurality of data registers FFR shown in FIG. 1 connected in series. The data registers FFR are included in the e-fuse block 22. Corresponding to the (7, 4) cyclic code, each set of seven data-registers FF6 to FF0 is provided with the selector circuit 44.

Corresponding to the (7, 4) cyclic code, the shift register 41 may temporarily hold, in the seven data registers FF0 to FF6, seven-bit data including redundancy data for an error correction. A single-bit correction using the (7, 4) cyclic code may thus be performed, as described below. The redundancy data and original effective data is written to the e-fuse block 22 as follows. Among the seven bits, the upper three-bit data registers (FF4-FF6) hold the redundancy data transferred thereto, and the lower four-bit data registers (FF0-FF3) store the original effective data (information bit) transferred thereto.

The syndrome generation circuit 42 receives data from the data register (FF0) in the least significant bit of the shift register 41. The circuit 42 then uses the effective data and the redundancy data to generate a syndrome that indicates the presence or absence of errors and their locations. Specifically, the syndrome generation circuit 42 includes a logic gate 181, an inverter circuit 182, exclusive logical OR circuits 183 and 185, and data registers 184, 186, and 187.

The logic gate 181 has one input terminal provided with data from the data register FF0 in the least significant bit of the shift register 41. The gate 181 has the other input terminal provided with a signal SYN. The logic gate 181 has an output terminal connected to an input terminal of the exclusive logical OR circuit 183 via the inverter circuit 182. The signal SYN is "H" during syndrome generation and "L" during other periods. Specifically, when the signal SYN is "H," data from the shift register 41 is sequentially sent to the logic gate 181 of the syndrome generation circuit 42.

The exclusive logical OR circuit 183 is located in the upstream of the data register 184. The output terminal of the circuit 183 connects to the input terminal of the register 184. Provided between the data registers 184 and 186 is the other exclusive logical OR circuit 185. The data registers 184, 186, and 187 form a three-stage shift register. The shift register transfers data to the next stage every time it receives one clock pulse CLK. The exclusive logical OR circuits 183 and 185 each have one terminal provided with feedback from the data register 187 at the lowest stage. The feedback is used to calculate a syndrome of the (7, 4) cyclic code input from the shift register 41. The syndrome is then held in the three-stage shift register including the flip-flop circuits 184, 186, and 187.

The error-correction circuit 43 includes a logic gate 191, a data register 192, an inverter circuit 193, and an exclusive logical OR circuit 194. The logic gate 191 outputs a logical negation value of a logical product, the logical product being calculated between latch data of the data register 184, reverse data of the latch data of the data register 186, and reverse data of the latch data of the data register 187.

The data register 192 is adapted to latch an input from the data register FF0 in the least significant bit of the shift register 41. The exclusive logical OR circuit 194 outputs, as an output signal SO, an exclusive logical OR of an output signal of the data register 192 and an output signal of the inverter 193.

The selector circuit 44 has an output terminal connected to the input terminal of the data register FF6. The circuit 44 also has two input terminals IN0 and IN1. The input terminal IN0 is used as an external-data input terminal SI for receiving data that is to be written to the memory cell 10 from outside. The input terminal IN1 receives an output signal from the data register FF0 in the least significant bit of the shift register 41. One of the input signals to the two input terminals IN0 and IN1 is selectively input to the data register FF6 according to the signal SYN input to a terminal SEL.

Figure 6:
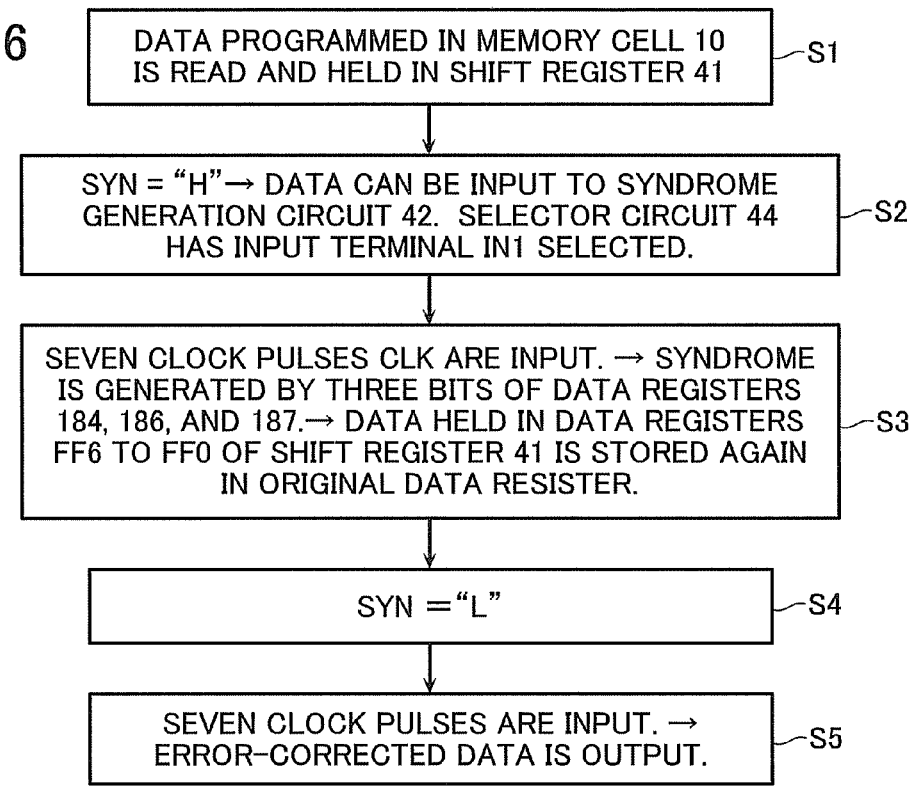
FIG. 6 is a flowchart of an operation of a non-volatile semiconductor storage device of a first embodiment.

Referring to the flowchart in FIG. 6, the operation of the non-volatile semiconductor storage device in this embodiment is described below. The data programmed in the memory cell 10 is read to the shift register 41 and is held therein (S1). The data registers FF0 to FF6 in the shift register 41 store seven-bit data including the redundancy data. As described above, the upper three-bit data registers (FF4-FF6) hold the redundancy data, and the lower four-bit data registers (FF0-FF3) hold the original effective data.

Then SYN is made "H," and it is made possible to input the output data of the data register FF0 in the least significant bit of the shift register 41 to the syndrome generation circuit 42. The input terminal IN1 is then selected among the input terminals IN1 and IN0 of the selector circuit 44 (S2). The output signal of the data register FF0 in the least significant bit of the shift register 41 is thus sequentially sent to the data register FF6 in the most significant bit. Data may thus be shifted or cycled in the shift register 41.

Seven clock pulses CLK are then input corresponding to the code length of the (7, 4) cyclic code (S3). For each input of the clock pulse CLK, data of the data registers FF6 to FF0 of the shift register 41 is shifted down (e.g., from FFi to FFi-1) by one bit and is input to the syndrome generation circuit 42 bit by bit, and the read data of the data register FF0 in the least significant bit is also written back to the data register FF6 in the most significant bit.

After the seven clock pulses CLK are completely input, the syndrome of the data held in the data registers FF6 to FF0 of the shift register 41 is generated in three bits of the data registers 184, 186, and 187. Because the input terminal INI is selected in the selector circuit 44, the data registers FF6 to FF0 of the shift register 41 shift the original data (the effective data, the redundancy data) therethrough and store the data at the original location. Specifically, the upper three-bit data registers (FF4-FF6) hold the redundancy data, and the lower four-bit registers (FF0-FF3) hold the original effective data.

Then the signal SYN becomes "L," and the shift register 41 and the syndrome generation circuit 42 are separated (S4). Note that the selector circuit 44 may have the input terminal IN0 or IN1 selected.

Seven clock pulses are then input to transfer the data outside (S5). For each input of the clock pulse, the shift register 41 outputs data from the data register FF0 in the least significant bit to the data register 192. The data stored in the data register 192 and the output data from the inverter circuit 193 are input to the exclusive logical OR circuit 194. The output data from the circuit 193 is an output signal according to the syndrome. The output terminal SO may thus output error-corrected effective data and redundancy data. Note that only the effective data is required outside and the redundancy data is not necessary. In this case, in order to read out only the effective data held in the lower four-bits of the shift register 41, only four clock pulses may be input. This control enables the error-corrected data to be transferred outside.

Figure 7:
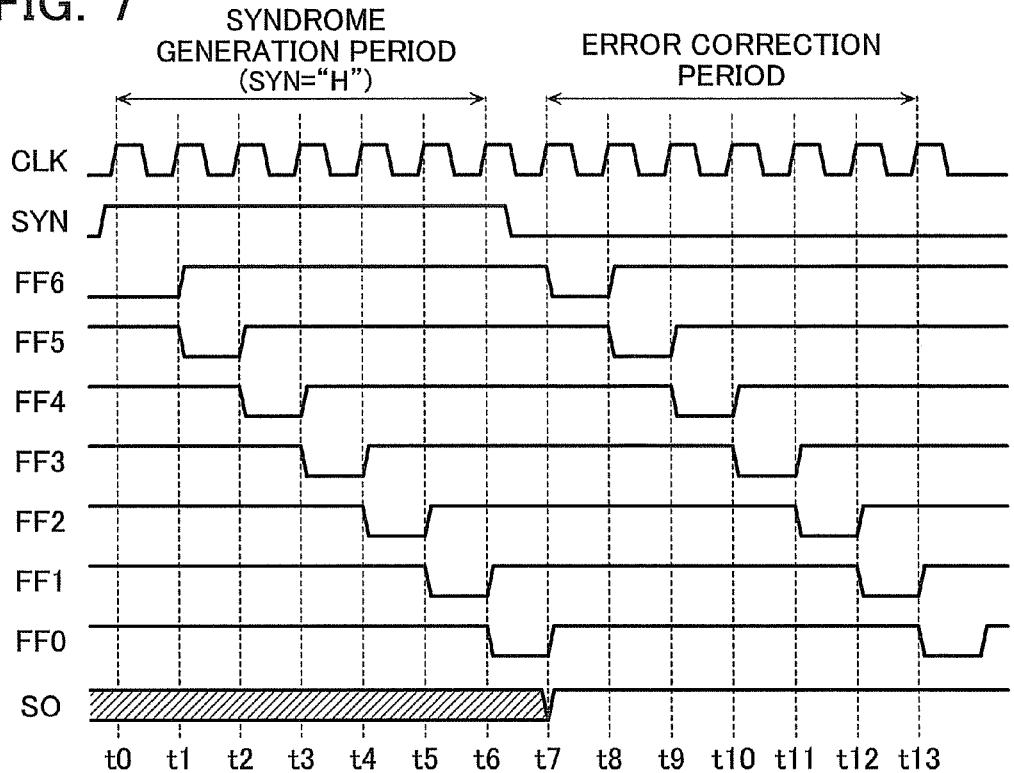
FIG. 7 is a timing chart of an operation of a non-volatile semiconductor storage circuit of a first embodiment.

FIG. 7 shows a timing chart of the operation of the non-volatile semiconductor storage circuit according to this embodiment. A description is given of an example of data reading when all of the seven-bit memory cells 10 are programmed with "1," only the memory cell 10 in the most significant bit is accidentally sensed as "0," and the data register FF6 in the most significant bit latches data "0."

At time t0, the signal SYN is changed to "H" to start the syndrome generation period. The data "0" that is accidentally stored only in the data register FF6 is shifted down bit by bit through the lower data registers FF6 to FF0 every time the clock pulse CLK is raised. When seven pulses are input (at time t7), the data "0" is returned to the original location in the shift register 41 (FF6-FF0).

The syndrome generation circuit 42 generates a syndrome according to the input seven-bit data. The generated syndrome is then stored in the data registers 184, 186, and 187. When, at time t7, the signal SYN is changed to "L," the syndrome generation is ended and the error correction starts according to the generated syndrome (t7 to t13). Specifically, the data of the shift register 41 is sequentially input to the error-correction circuit 43 according to the clock pulse CLK. The error correction is then performed according to the syndrome, thus outputting the error-corrected output data SO.

Thus, in this embodiment, the non-volatile semiconductor device that holds data in the shift register includes, at the output of the shift register, the syndrome generation circuit and the error-correction circuit. When the syndrome is generated, data read from the shift register is rewritten, thereby correcting the errors. The increase of the circuit scale for correcting errors may thus be minimized.

Second Embodiment

Figure 8:
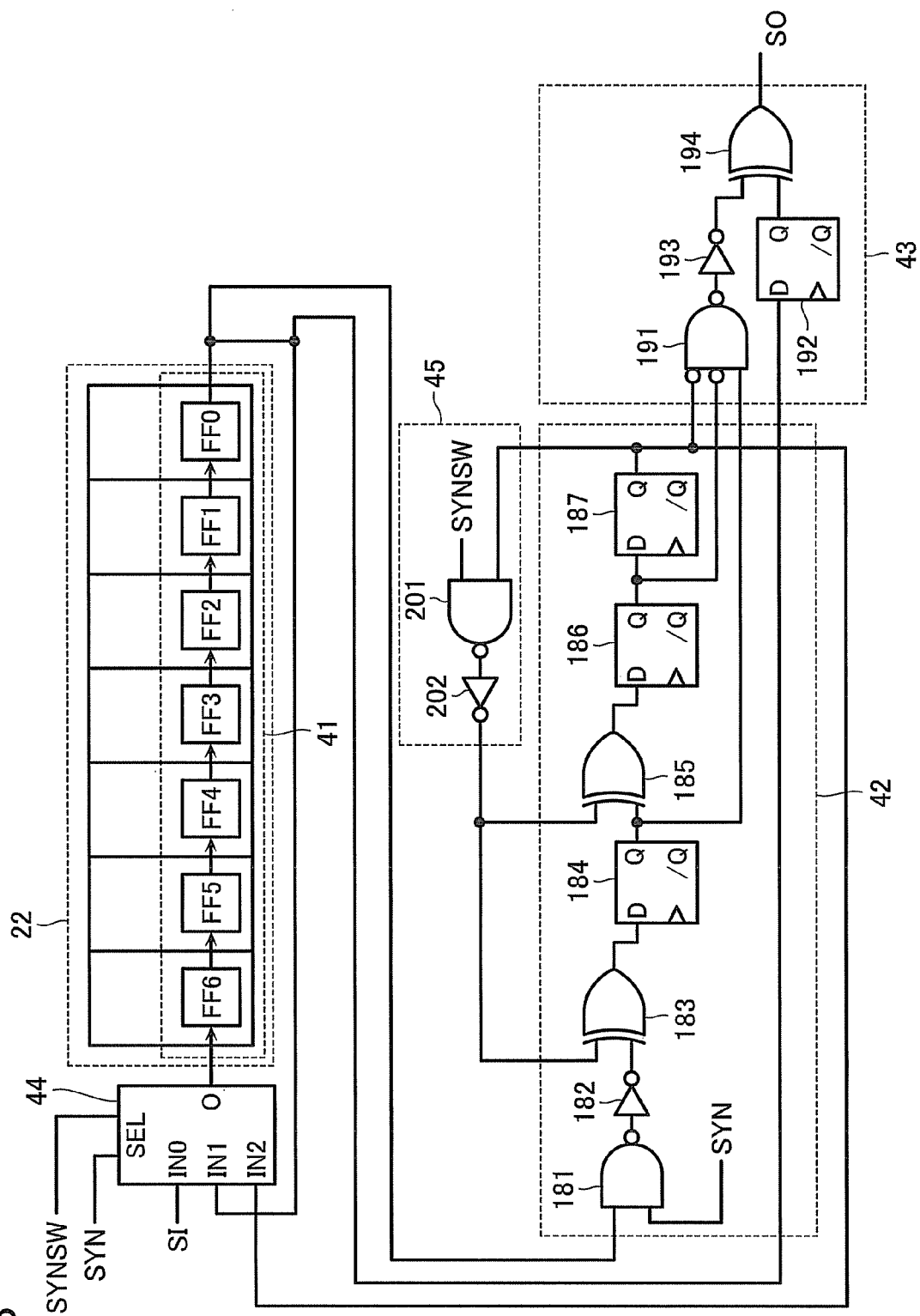
FIG. 8 illustrates a non-volatile semiconductor storage device according to a second embodiment of the present invention.

Referring to figures including FIG. 8, a non-volatile semiconductor storage device according to a second embodiment of the present invention is described. The non-volatile semiconductor storage device according to the second embodiment is also based on the non-volatile semiconductor storage device in the first example. In the drawings, like elements as these of the device in the first embodiment are designated with like reference numerals, and their detailed description is omitted here.

The non-volatile semiconductor storage device in this embodiment differs from the device in the first embodiment in that the syndrome generation circuit 42 includes an encode-control circuit 45 as a portion thereof. The encode-control circuit 45 may generate three-bit redundancy data from four-bit effective data. The circuit 45 may then add the redundancy data to the effective data, thereby generating (7, 4) cyclic code.

The encode-control circuit 45 includes a NAND gate 201 and an inverter circuit 202. The NAND gate 201 has one input terminal supplied with an output signal from the data register 187. The gate 201 has the other input terminal supplied with a signal SYNSW. The signal SYNSW is "L" when generating the redundancy data. The syndrome generation circuit 42 then functions as an encoder. Otherwise, the signal SYNSW is "H" and the output signal from the data register 187 is directly input to the exclusive logical OR circuits 183 and 185. The syndrome generation circuit 42 may thus generate the syndrome.

In this embodiment, the selector circuit 44 includes three input terminals IN0 to IN2 and may select one of them. One of the three input terminals, IN2, may receive an output signal from the data register 187 at the lowest stage of the syndrome generation circuit 42. The selector circuit 44 selects, according to the signals SYN and SYNSW, one of the input terminals IN0 to IN2 to receive an input signal therethrough. The other portions are similar to those in the first embodiment.

The operation of the non-volatile semiconductor storage device according to the second embodiment is described below.

Figure 9:
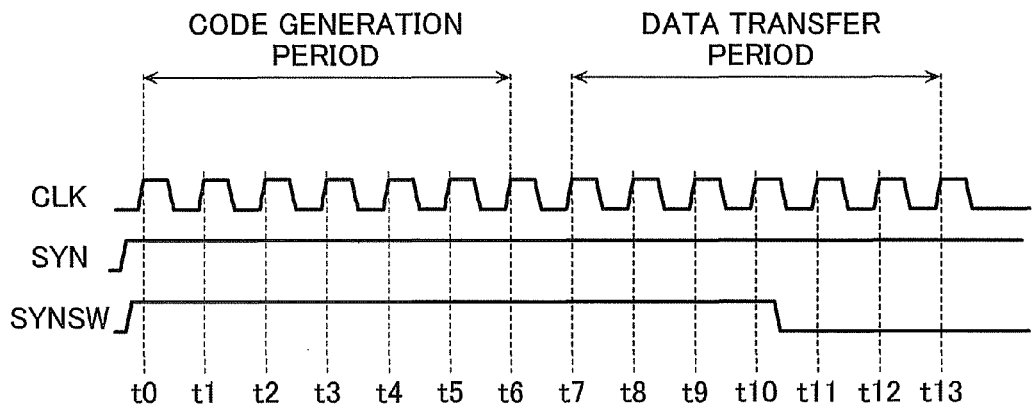
FIG. 9 is a timing chart of an operation (redundancy-data generation procedure (encoding procedure)) of a non-volatile semiconductor storage circuit of a second embodiment.

Referring to FIG. 9, a description is first given of the procedure of generating the three-bit redundancy data from the four-bit effective data (encoding procedure). First, the seven data-registers (FF0, FF1, FF2, FF3, FF4, FF5, FF6) of the shift register 41 store data (i0, i1, i2, i3, 0, 0, 0), respectively. The data (i0, i1, i2, i3) is the four-bit effective data. The data (0, 0, 0) is stored in the portions (FF4, FF5, FF6), which stores redundancy data (p0, p1, p2) that is generated later.

Then at time t0, the signals SYN and SYNSW are both changed to "H" (see FIG. 9). The change of the signal SYN to "H" makes it possible to input data of the shift register 41 to the syndrome generation circuit 42. Then at time t0 to t7 (code generation period), seven clock pulses CLK are input. The data registers 184, 186, and 187 thus store the redundancy data (p0, p1, p2) that is to be added to the effective data (i0, i1, i2, i3).

The seven data-registers (FF0, FF1, FF2, FF3, FF4, FF5, FF6) of the shift register 41 receive the seven clock pulses CLK at time t0 to t7. Data is thus shifted in the register 41, and the data (i0, i1, i2, i3, 0, 0, 0) is stored in the seven data-registers, respectively.

After time t7, the redundancy data (p0, p1, p2) is transferred from the data registers 184, 186, and 187, respectively, to the shift register 41. Note, however, that before the redundancy data (p0, p1, p2) is transferred, four clock pulses CLK are input at time t7 to t10, thereby transferring the effective data (i0, i1, i2, i3) in the shift register 41 and storing the data in the data registers (FF3, FF4, FF5, FF6). During the period of t7 to t10, the encode-control circuit 45 receives no clock pulses CLK. The data registers 184, 186, and 187 thus keep the redundancy data (p0, p1, p2) stored therein.

Then at time t10, the signal SYNSW is made "L," and the output from the shift register 187 at the lowest stage of the syndrome generation circuit 42 is input to the input terminal of the selector circuit 44. The encode-control circuit 45 is then set to be operable in synchronism with the clock pulse CLK. Three clock pulses CLK are then input at time t11 to t13. In the shift register 41, therefore, the data registers (FF0, FF1, FF2, FF3, FF4, FF5, FF6) store data (i0, i1, i2, i3, p0, p1, p2), respectively. Specifically, the shift register 41 stores the original effective data (i0, i1, i2, i3) and the redundancy data (i0, i1, i2, i3). The redundancy data is generated by the encoder circuit 43.

Figure 10:
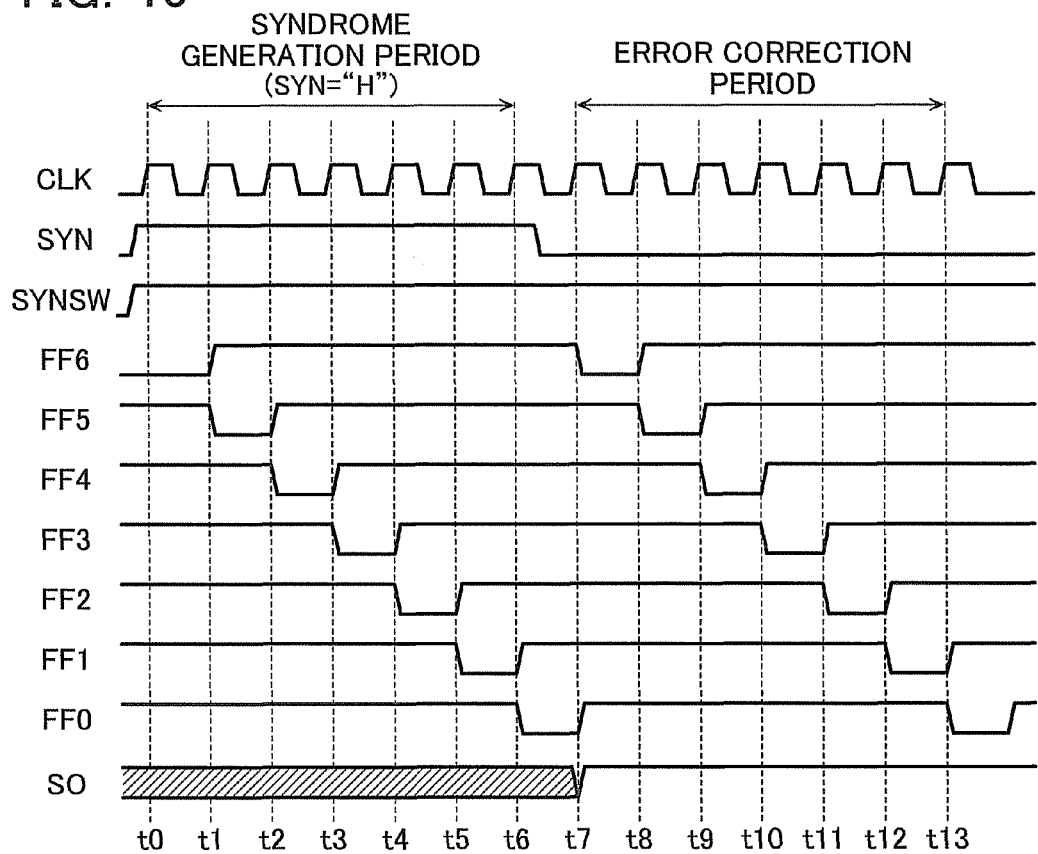
FIG. 10 is a timing chart of an operation (a syndrome generation procedure and an error correction procedure) of a non-volatile semiconductor storage circuit of a second embodiment.

FIG. 10 shows a timing chart of the operations of the syndrome generation and the error correction in the non-volatile semiconductor storage circuit in this embodiment. The timing chart in FIG. 10 is the same as that in the first embodiment (FIG. 7) except that the signal SYNSW is "H" to select the input terminal IN1 in the selector circuit 44.

Third Embodiment

Figure 11:
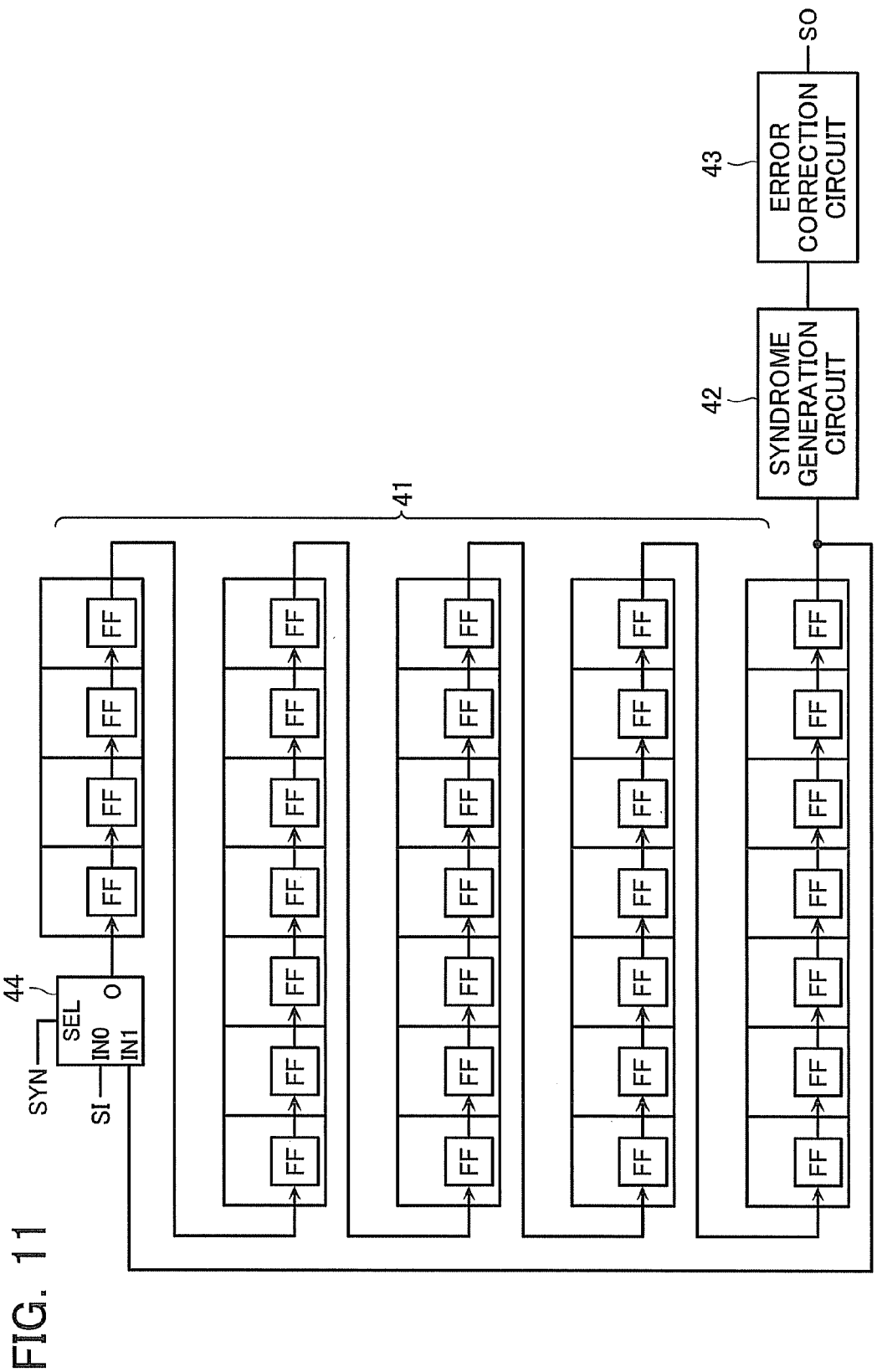
FIG. 11 illustrates a non-volatile semiconductor storage device according to a third embodiment of the present invention.

Referring to FIG. 11, a non-volatile semiconductor storage device according to a third embodiment of the present invention is described below. The non-volatile semiconductor storage device in the third embodiment is also based on the non-volatile semiconductor storage device in the first example. In the drawing, like elements as those of the device in the first embodiment are designated with like reference numerals, and their detailed description is omitted here.

The foregoing embodiments include the seven-bit data registers FF0 to FF6 in the shift register 41, and use the (7, 4) cyclic code therein. In contrast, this embodiment includes, as shown in FIG. 11, 32 data-registers FF in the shift register 41 and the selector circuit 44 at the beginning of the register 41, and uses a (32, 26) cyclic code therein. Because a different cyclic code is used, the syndrome generation circuit 42 and the error-correction circuit 43 are formed in a different format suitable to that code.

Fourth Embodiment

Figure 12:
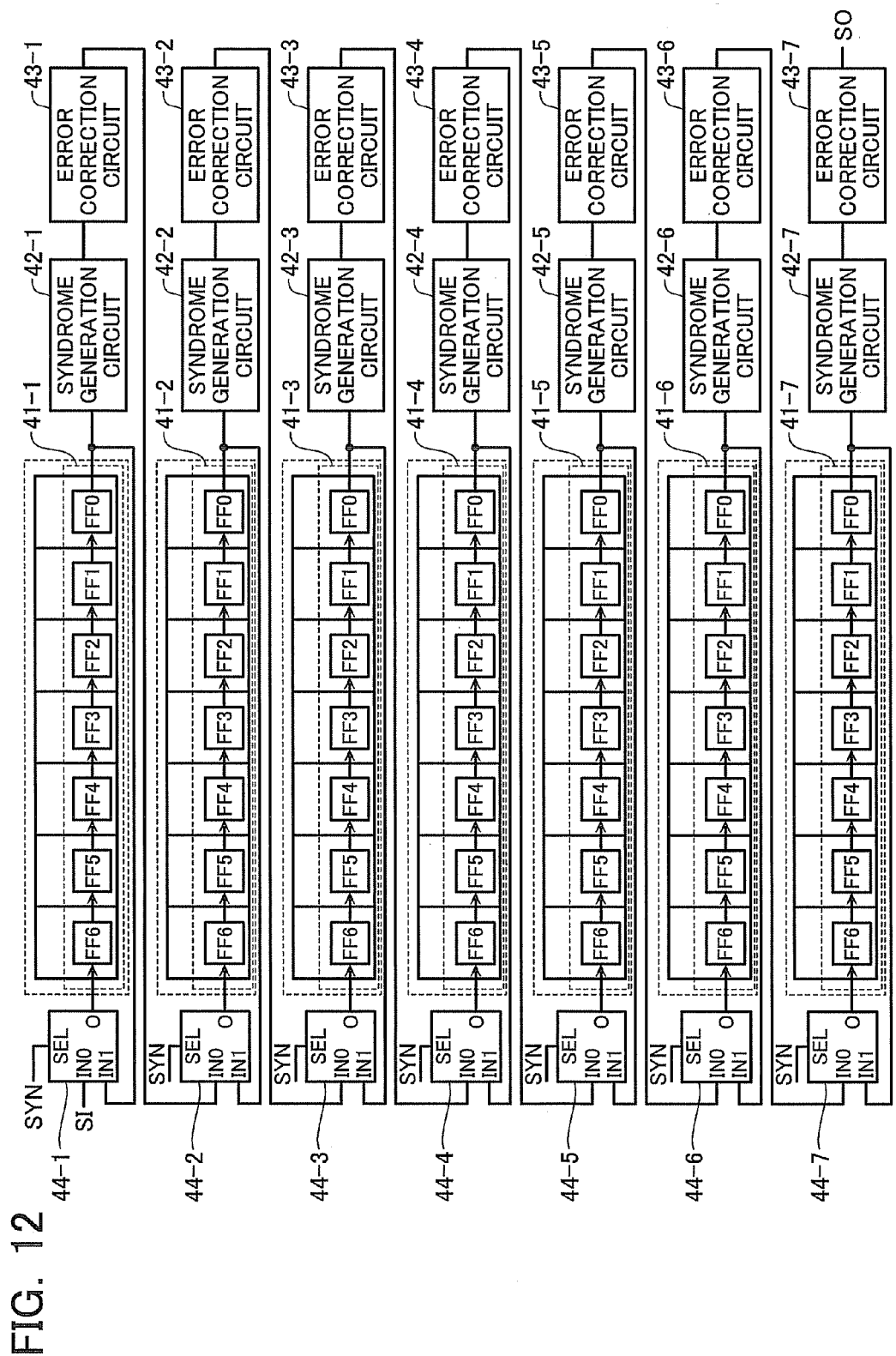
FIG. 12 illustrates a non-volatile semiconductor storage device according to a fourth embodiment of the present invention.

Referring to FIG. 12, a non-volatile semiconductor storage device according to a fourth embodiment of the present invention is described below. The non-volatile semiconductor storage device in the fourth embodiment is also based on the non-volatile semiconductor storage device in the first example. In the drawing, like elements as those of the device in the first embodiment are designated with like reference numerals, and their detailed description is omitted here.

This embodiment includes a plurality of selector circuits 44-i (i=1 to 7), syndrome generation circuits 42-i, and error-correction circuits 43-i. This embodiment also includes seven data-register groups (shift registers) 41-i, each being included in the shift register 41. One selector circuit 44-i, one syndrome generation circuit 42-i, and one error-correction circuit 43-i are provided before or after each data-register group 41-i. Specifically, this embodiment uses seven (7, 4) cyclic codes. FIG. 12 only shows block diagrams of the syndrome generation circuit 42-i and the error-correction circuit 43-i and omits the details. The circuits 42-i and 43-i may, however, be similar in configuration to the circuits 42 and 43 in the first embodiment, respectively. The selector circuit 44-i includes two input terminals IN0 and IN1. Connected to the input terminal IN0 is an output from the error-correction circuit 43-i–1 at the upper stage. Connected to the input terminal IN1 is an output (of the data register FF0) in the least significant bit of the shift register 41-i in the same block.

The third and fourth embodiments both increase the degree of integration of the data register. They have, however, advantages and disadvantages. It is assumed here that the third embodiment uses the (32, 26) cyclic code to handle 26-bit data as described above and the fourth embodiment provides four sets of four bits of the (7, 4) cyclic code to handle 28-bit data.

The third embodiment performs the 26-bit code processing collectively. The effective data is thus added with small redundancy data (6 bit) and the processing requires a small-scale circuit. Unfortunately, the processing is time extensive. Further, when the degree of integration needs to be changed, the logic of the code processing (the configurations of the syndrome generation circuit and the error-correction circuit) also needs to be changed. In contrast, the fourth embodiment includes a plurality of layered small seven-bit data registers. The effective-data of the same length is thus added with larger redundancy data than that in the third embodiment, and the processing requires a larger circuit. In the fourth embodiment, the code processing may be performed in parallel quickly. The degree of integration may be changed simply with a change of the number of layered data-registers. The fourth embodiment thus has a greater degree of freedom for extension than the third embodiment. In this way, the third and fourth embodiments both have advantages and disadvantages. These two embodiments may be used as appropriate to provide a variety of applications.

Fifth Embodiment

Figure 13:
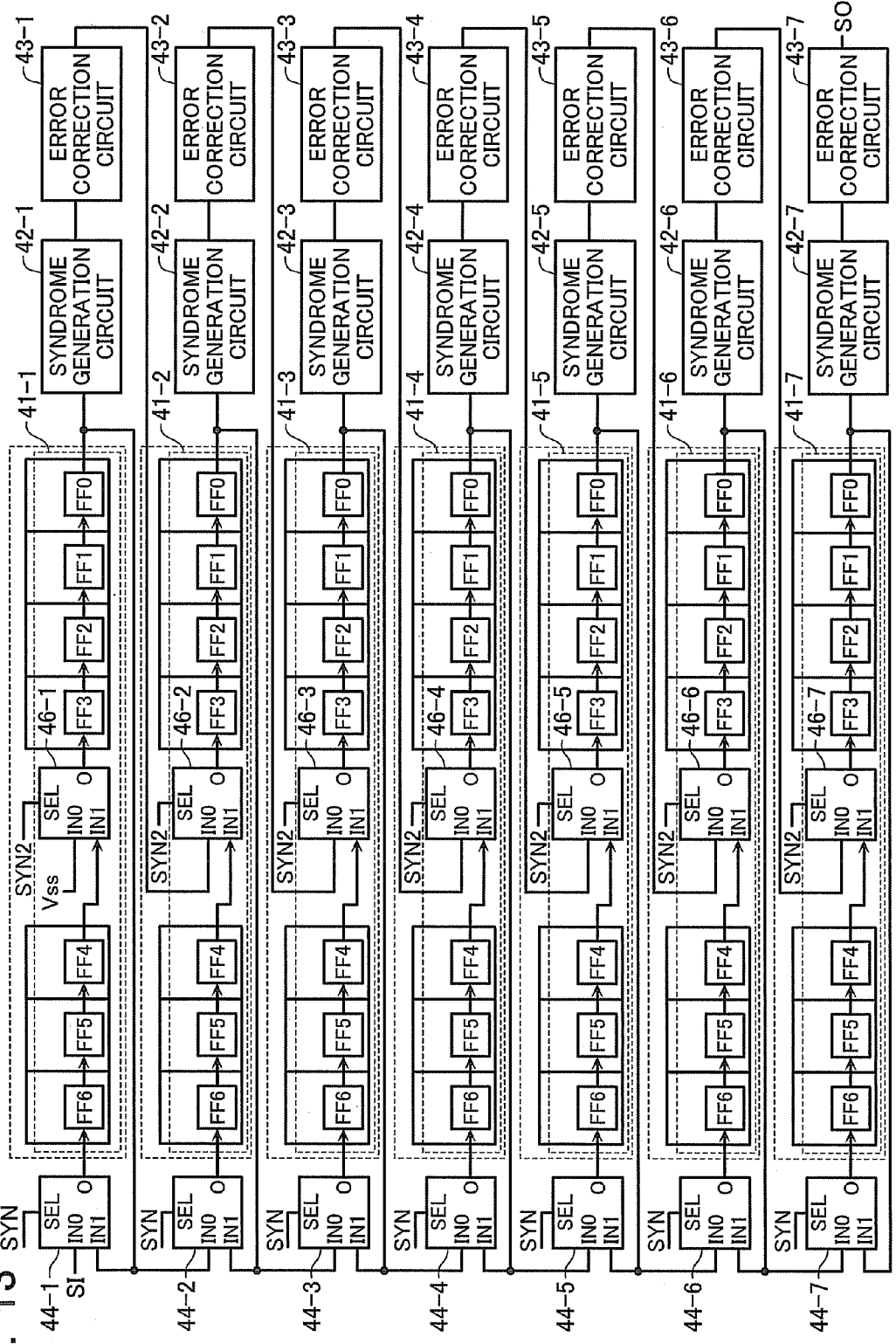
FIG. 13 illustrates a non-volatile semiconductor storage device according to a fifth embodiment of the present invention.

Referring to FIG. 13, a non-volatile semiconductor storage device according to a fifth embodiment of the present invention is described below. The non-volatile semiconductor storage device in the fifth embodiment is also based on the non-volatile semiconductor storage device in the first example. In the drawing, like elements as those of the device in the fourth embodiment are designated with like reference numerals, and their detailed description is omitted here.

This embodiment differs from the fourth embodiment in that the shift register 41-i includes a selector circuit 46-i between the data registers FF4 and FF3 (i.e., at the boundary between the effective data and the code data). In this embodiment, the selector circuit 46-i removes the redundancy data not to output it externally. The redundancy data is unnecessary outside of the device.

The selector circuit 44-i includes two input terminals IN0 and IN1. The input terminal IN0 receives an output (of the data register FF0) in the least significant bit of the upper shift register 41-i-1. Note, however, that the input terminal IN0 of the selector circuit 44-1 at the highest stage is used as the input terminal SI for an input signal from outside.

Connected to the other input terminal IN1 is an output (of the data register FF0) in the least significant bit of the code data in the same block. The two input terminals IN0 and IN1 may be switched by the signal SYN.

The selector circuit 46-i also includes two input terminals IN0 and IN1. Connected to the input terminal IN0 is an output from the upper error-correction circuit 43-i-1 (note, however, that the input terminal IN0 of the selector circuit 46-1 is connected to the ground potential Vss). Connected to the other input terminal IN1 is the output (of the data register FF4) in the least significant bit of the code data in the same block. The two input terminals IN0 and IN1 may be switched by a signal SYN2. Then, the signals SYN and SYN2 are switched to select one of the following three modes:
(1) a mode where the input terminal SI transfers the effective data and the code data to the shift register 41-I;
(2) a mode where the syndrome generation circuit 42-i generates the syndrome and stores it; and
(3) a mode where after the error-correction circuit 43-i corrects errors, the output terminal SO transfers data outside.

Figure 14A:
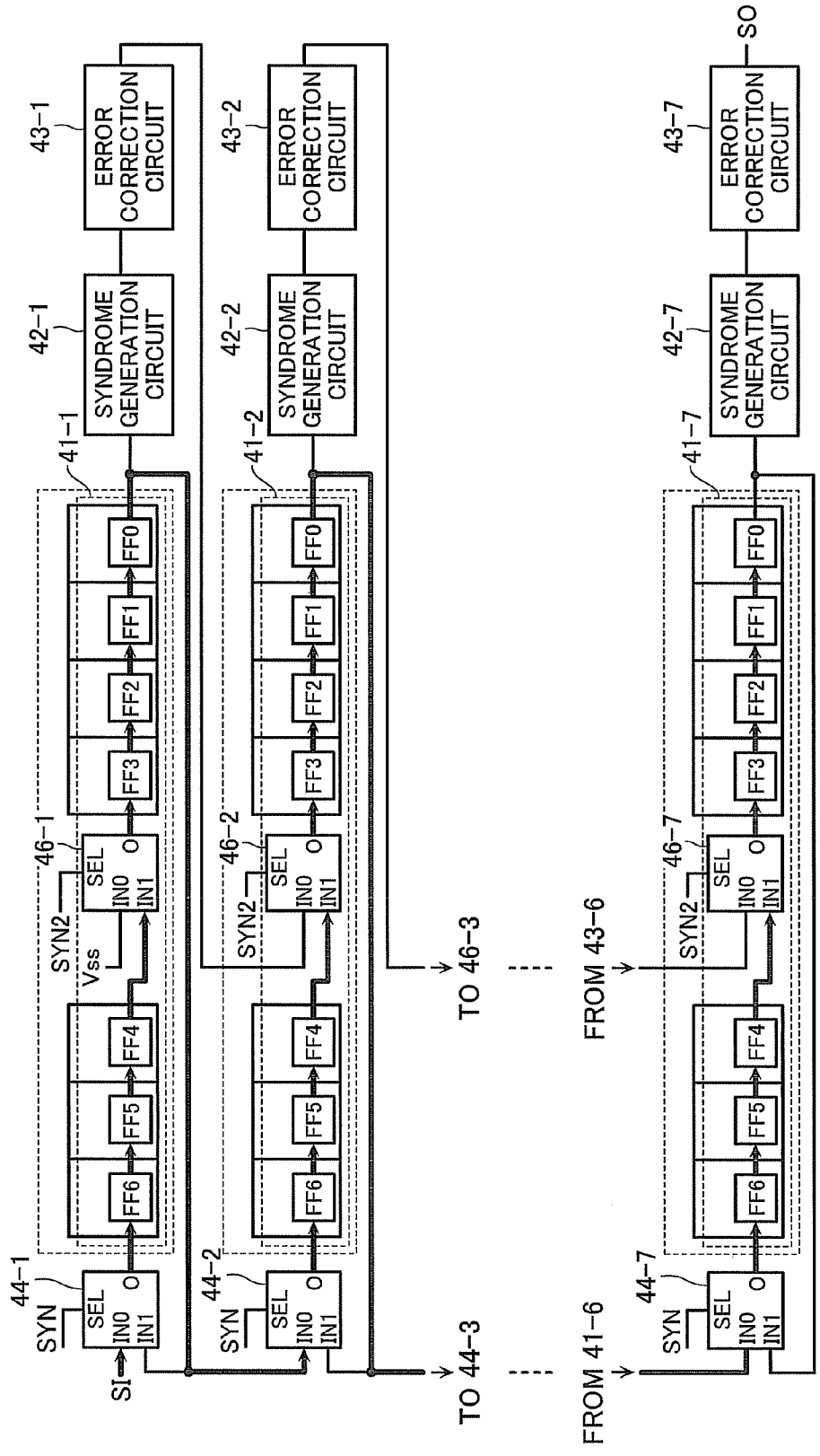
FIG. 14A illustrates an operation of a non-volatile semiconductor storage device of a fifth embodiment.

Referring to FIG. 14A, the operation of the mode (1) is described. The mode (1) does not use the syndrome generation circuit 42-i or the error-correction circuit 43-i. The selector circuit 44-i selects the input terminal IN0. The selector circuit 46-i selects the input terminal IN1. Referring to FIG. 14A, all shift registers 41-i (i=1 to 7) are thus connected in series. The total seven-bit data of the four-bit effective data and the three-bit code data may then be input through one input terminal SI in units of seven bits of the shift registers 41-i. Data may thus be transferred to the whole cells (7×7 bits).

Figure 14B:
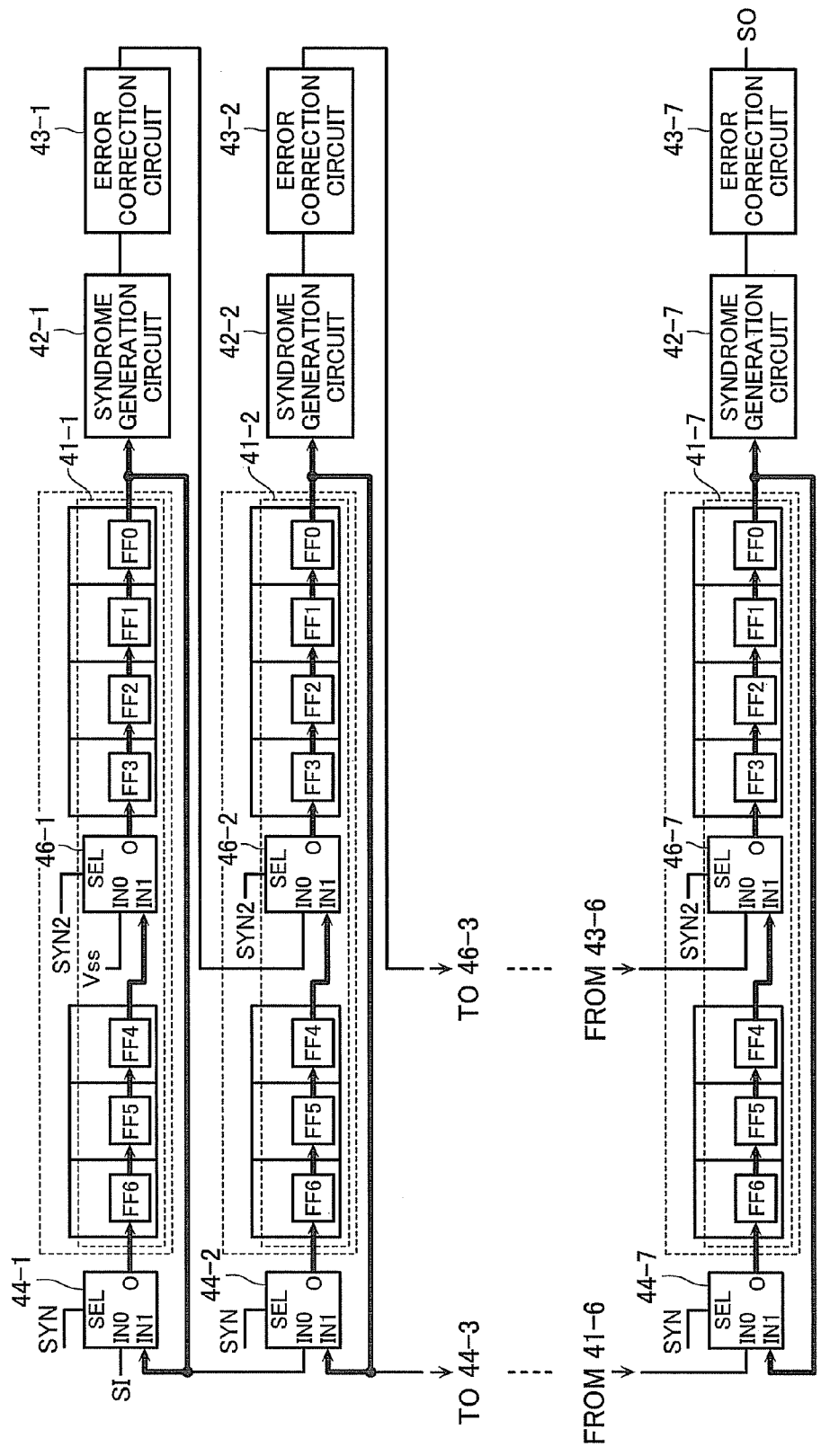
FIG. 14B illustrates an operation of a non-volatile semiconductor storage device of a fifth embodiment.

Referring to FIG. 14B, the operation of the mode (2) is described. The mode (2) uses the syndrome generation circuit 42-i, but does not use the error-correction circuit 43-i. The selector circuit 44-i selects the input terminal IN1. The selector circuit 46-i selects the input terminal IN1. A control may thus be implemented so that the syndrome is generated in units of seven bits of the shift registers 41-i and the effective data is returned to the original shift register 41-i after the syndrome generation.

Referring to FIG. 14C, the operation of the mode (3) is described. The mode (3) uses both of the syndrome generation circuit 42-i and the error-correction circuit 43-i. Note that since the selector circuit 44-i is not used, either the input terminal IN0 or IN1 may be selected.

The selector circuit 46-i selects the input terminal IN0. The lower four bits of the seven-bit data stored in the shift register 41, i.e., the effective data, is therefore only transferred to the shift register 41-i at the next stage through the error-correction circuit 43-i or is transferred outside from the output terminal SO. When, therefore, the data saved in the shift register 41-i is transferred outside, only the effective data may be transferred and the redundancy data is not.

Sixth Embodiment

Figure 15:
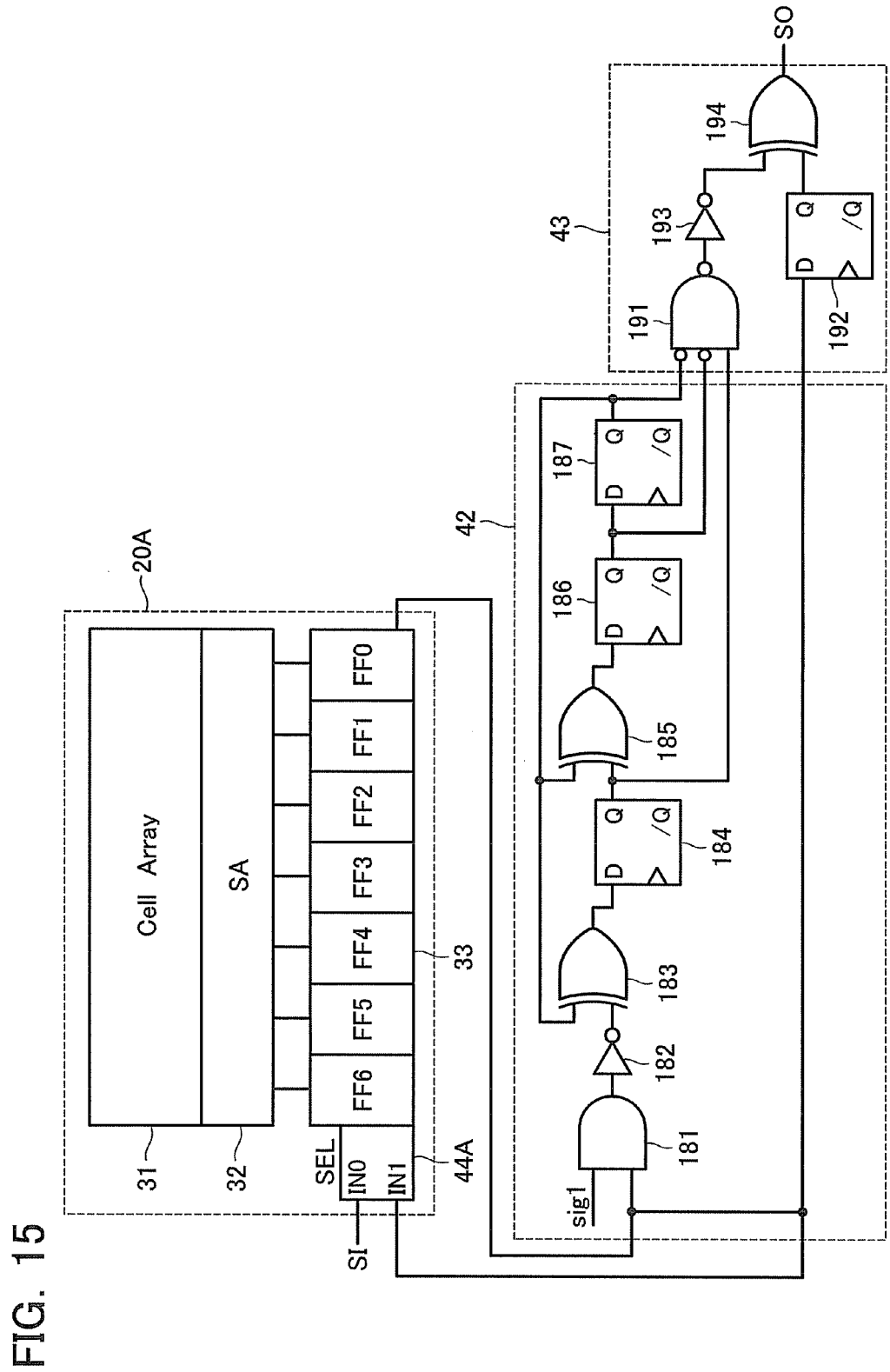
FIG. 15 illustrates a non-volatile semiconductor storage device according to a sixth embodiment of the present invention.

Referring to FIG. 15, a non-volatile semiconductor storage device according to a sixth embodiment of the present invention is described below. Unlike the first to fifth embodiments, the sixth embodiment is based on the non-volatile semiconductor storage device in the second example (FIGS. 3 and 4). In the drawing, like elements as those of the device in the first embodiment are designated with like reference numerals, and their-detailed description is omitted here.

This embodiment includes, for each shift register 33 including seven data registers FF6-FF0 shown in FIG. 4, the syndrome generation circuit 42, the error-correction circuit 43, and the selector circuit 44A.

The syndrome generation circuit 42 and the error-correction circuit 43 are similar to and have similar elements to those in the first embodiment. Their description is thus omitted here. FIG. 15 shows an example where the (7, 4) cyclic code is used. A different cyclic code may be used by changing the number of data registers FF and the configurations of the syndrome generation circuit 42, the error-correction circuit 43, and the selector circuit 44A in a similar way to the foregoing embodiments.

Seventh Embodiment

Figure 16:
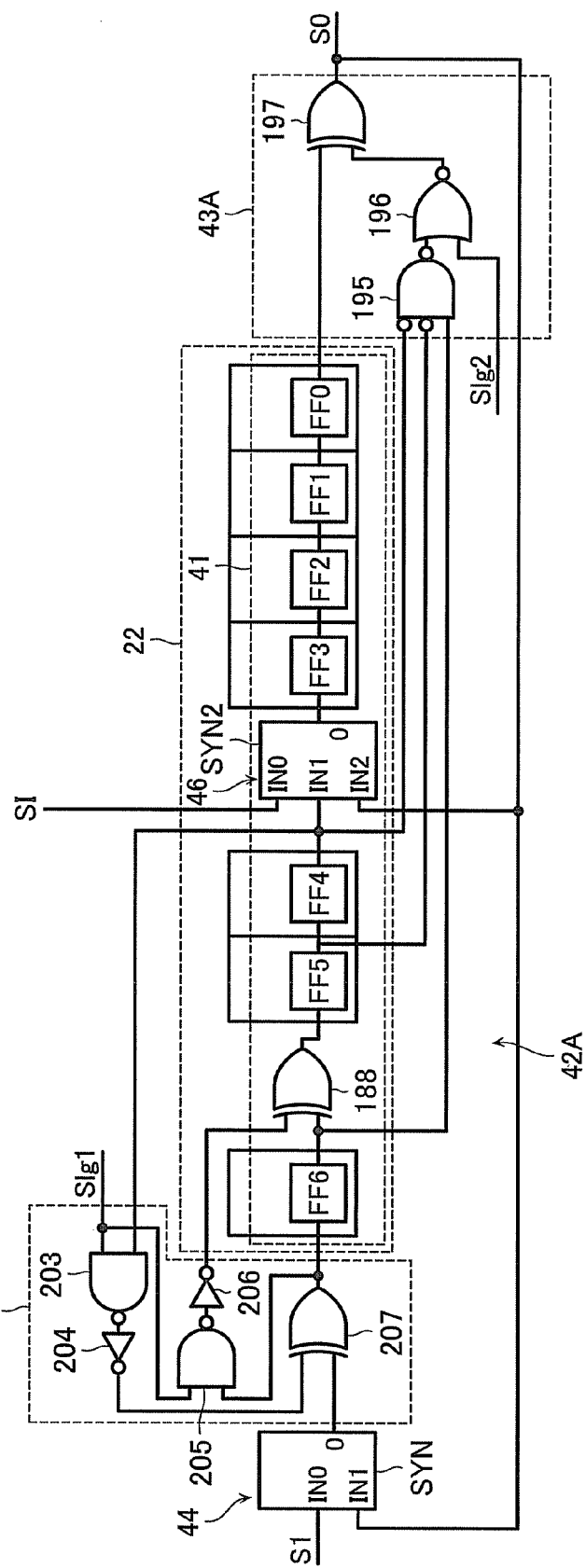
FIG. 16 illustrates a non-volatile semiconductor storage device according to a seventh embodiment of the present invention.

Referring to FIG. 16, a non-volatile semiconductor storage device according to a seventh embodiment of the present invention is described below. The non-volatile semiconductor storage device in the seventh embodiment is also based on the non-volatile semiconductor storage device in the first example. In the drawing, like elements as those of the device in the fourth embodiment are designated with like reference numerals, and their detailed description is omitted here.

The nonvolatile semiconductor storage device according to this embodiment adds a syndrome generation circuit 42A, an error-correction circuit 43A, a selector circuit 44, a encode-control circuit 45A, and a selector circuit 46 to the nonvolatile semiconductor storage device with a 7-bit e-fuse block 22 according to the first example.

The nonvolatile semiconductor storage device according to this embodiment is equipped a selector circuit 46 between the data register FF4 and FF3 (the boundary between the effective data and the redundancy data), like the fifth embodiment. In this embodiment, the selector circuit 46 removes the redundancy data which is an unnecessary outside, and prevents the redundancy data from being output to outside.

Furthermore, this embodiment is different from the other embodiments in that the syndrome generation circuit 42A and the encode-control circuit 45A use the data registers FF0-FF6 in the shift register 41 as a shift register for generating and obtaining a syndrome, and for generating redundancy data. Accordingly, this embodiment enables the circuit scale to be smaller compared to the above-mentioned embodiments.

Hereafter, the configuration of the nonvolatile semiconductor storage device according to this embodiment is explained in detail.

The error-correction circuit 43A is equipped with a logic gate 195, a NOR gate 196, and an exclusive logical OR circuit 197. The logic gate 195 outputs a logical negation value of a logical product, the logical product being calculated between reverse data of the latched data in the data register FF6, reverse data of the latched data in the data register FF5, and reverse data of the latched data in the data register FF4. As described later, a syndrome generated by the syndrome generation circuit 42A is stored in the data registers FF6-FF4.

The NOR gate 196 receives the output signal from the logic gate 195 and the signal Sig2 to output a logical negation value of the logical sum of these input signals. The exclusive logical OR circuit 197 receives the output signal from the NOR gate 196 and the latch data of data register FF0 to output as the exclusive logical OR signal thereof as an output data SO.

Moreover, the encode-control circuit 45A is equipped with a NAND gate 203, an inverter circuit 204, a NAND gate 205, an inverter circuit 206, and an exclusive logical OR circuit 207. Moreover, the encode-control circuit 45A includes the shift register 41 as one of its components. The NAND gate 203 outputs the logical negation value of the logical product of the signal Sig1 and the latched data in the data register FF4. The output signal from this NAND gate 203 is supplied to an input terminal of the inverter circuit 204.

Moreover, the NAND gate 205 outputs the negation value of the logical product concerning the signal Sig1 and the output signal of the exclusive logical OR circuit 207. The output signal from the NAND gate 205 is supplied to the inverter circuit 206, and the inverter circuit 206 outputs the reverse signal thereof. Moreover, the exclusive logical OR circuit 207 outputs the exclusive logical OR signal of the output signal of the selector circuit 44 and the output signal of the inverter circuit 204.

Moreover, the syndrome generation circuit 42A includes a shift register 41, an exclusive logical OR circuits 188, 197, and 207. The exclusive logical OR circuit 188 is connected between the data registers FF6 and FF5.

The output signal of the data register FF6 is supplied to one input terminal of the exclusive logical OR circuit 188, and the output signal of the inverter circuit 206 in the encode-control circuit 45A is supplied to the other input terminal of the exclusive logical OR circuit 188. After redundancy data is stored in the data registers FF6-FF4 and effective data is stored in the data registers FF3-FF0, the syndrome generation circuit 42A cycles the data in the shift register 41 to generate and store the syndrome in the data registers FF6-FF4 instead of the redundant data.

Next, the operation of the nonvolatile semiconductor storage device according to this embodiment is explained hereinbelow.

First, when data from external is taken into the shift register 41, the signals SYN1 and SYN2 is changed to "H". Thereby, the input terminal IN0 is selected in the selector circuit 44, and the input terminal IN1 is selected in the selector circuit 46. Moreover, the signal Sig1 and Sig2 is changed to the ground potential Vss and the supply voltage VDD, respectively. Furthermore, the encode-control circuit 45A stops its operation, and the error-correction circuit 43A functions as a mere data path. Note that the input terminal IN0 may be selected in the selector circuit 46 when the redundant data is not transferred but only the effective data is transferred from external.

Next, the case where redundant data is generated using the encode-control circuit 45A is explained. After obtaining effective data from external as mentioned above and storing it in the data registers FF3-FF0, both the signals Sig1 and Sig2 are set at the supply voltage VDD. In addition, the input terminals IN1 and IN2 are selected in the selector circuits 44 and 46, respectively. Thereby, the encode-control circuit 45A starts an operation, and the error-correction circuit 43A functions as a mere data path.

In this status, the data transfer of 4 bits is performed to cycle the effective data stored in the data registers FF3-FF0 through the input terminal IN2 of the selector circuit 46 to take a round.

On the other hand, the data output from the output terminal of the error-correction circuit 43A serving as a mere data path is supplied to the encode-control circuit 45A through the input terminal IN1 of the selector circuit 44. When the 4-bit data transfer is completed, the data registers FF6-FF4 stores the redundant data corresponding to the effective data.

Next, the case where a syndrome is generated using the syndrome generation circuit 42A is explained. It is assumed here that redundant data is stored in the data registers FF6-FF4, and effective data is stored in the data registers FF3-FF0 after the above-mentioned operation.

In this status, the signals Sig1 and Sig2 are set at the ground potential VSS and the supply voltage VDD, respectively. In addition, the input terminal IN1 is selected in the selector circuits 44 and 46, respectively. Then, the data transfer of 3 bits is performed. Thereafter, the data transfer for 4 bits is performed again after the signal Sig1 is changed to the supply voltage VDD. Thereby, a syndrome is generated and stored in the data registers FF6-FF4 instead of the redundant data.

Next, the error-correction operation by the error-correction circuit 43A is explained. The signal Sig1 and Sig2 are set at the supply voltage VDD and the ground potential VSS, respectively. The selector circuit 44 is controlled to output the ground potential VSS, and the selector circuit 46 selects input terminal IN2.

In this status, the data transfer of 4 bits is performed to perform an error correction based on the syndrome stored in the data registers FF6-FF4 and supplied to the logic gate 195, and the effective data supplied to the exclusive logical OR circuit 197. The error-corrected data is output sequentially from the output terminal SO.

As explained above, this embodiment may decrease the number of data registers, thereby it suppress the size of the circuit.

Eighth Embodiment

Figure 17:
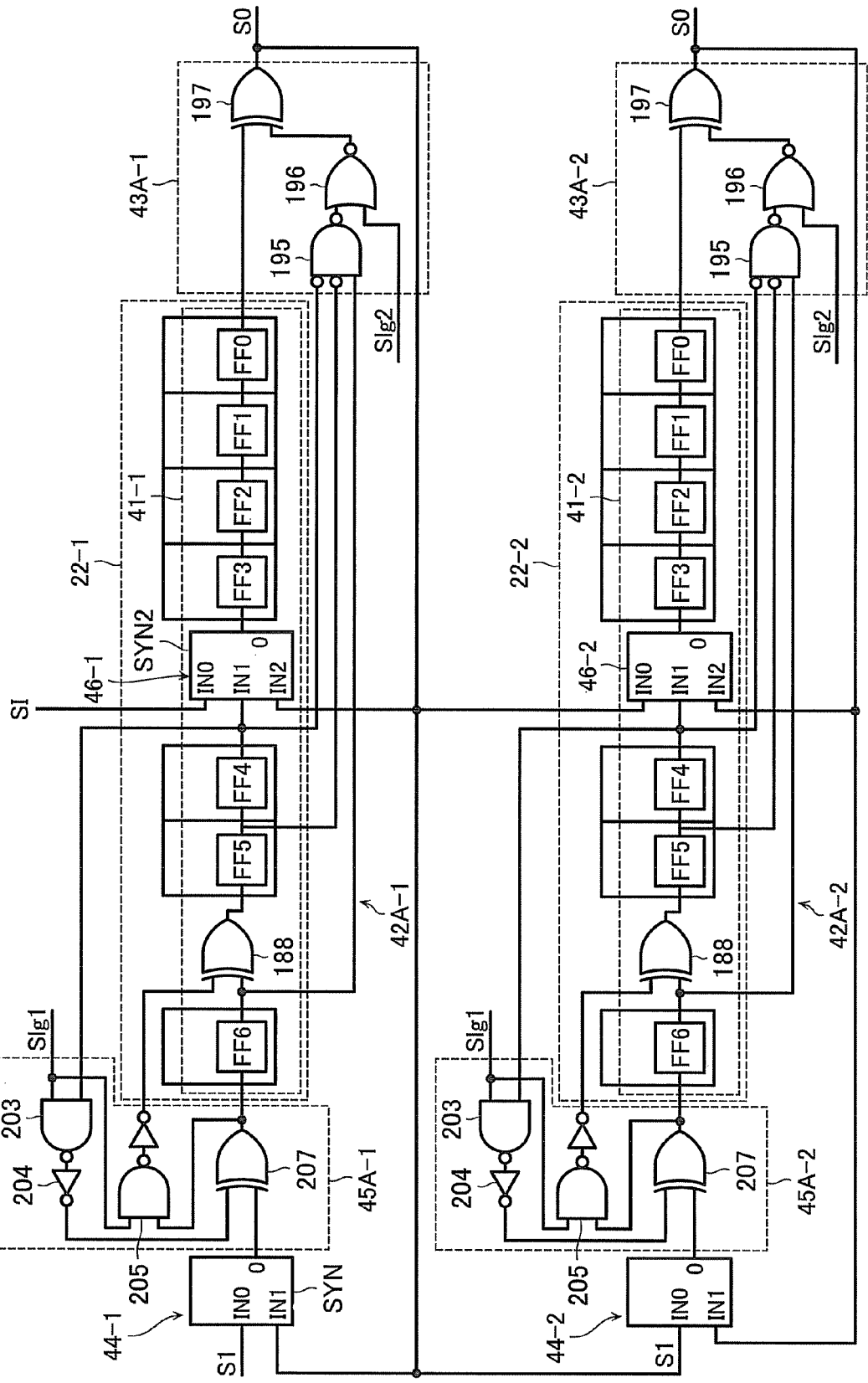
FIG. 17 illustrates a non-volatile semiconductor storage device according to a eighth embodiment of the present invention.

Referring to FIG. 17, a non-volatile semiconductor storage device according to a eighth embodiment of the present invention is described below. The non-volatile semiconductor storage device in the seventh embodiment is also based on the non-volatile semiconductor storage device in the first example. In the drawing, like elements as those of the device in the fourth embodiment are designated with like reference numerals, and their detailed description is omitted here.

The nonvolatile semiconductor storage according to this embodiment connects two sets of the 7-bit e-fuse blocks of the seventh embodiment (FIG. 16) in series. The e-fuse block 22-1 and 22-2 both have the same configuration as that of the seventh embodiment. That is, the upper-stage e-fuse block 22-1 is equipped with a selector circuit 44-1, 46-1, a syndrome generation circuit 42A-1, an error-correction circuit 43A-1, and an encode-control-circuit 45A-1. The lower-stage e-fuse block 22-2 is equipped with a selector circuit 44-2, 46-2, a syndrome generation circuit 42A-2, an error-correction circuit 43A-2, and an encode-control-circuit 45A-2. The error-correction circuit 43A-1 has an output terminal SO connected to the input terminal IN0 of the selector circuit 44-2 and the input terminal IN0 of the selector circuit 46-2.

Having the above-described configuration, the e-fuse block 22-1 and 22-2 each generates redundancy data and syndrome, and performs error correction. The data transfer after completion of the error correction can be performed by, for example, outputting the data after the error correction supplied from the output terminal SO of the block 22-1 to the lower-stage selector circuit 46-2. In this case, the signal Sig2 is set at the supply voltage VDD at the timing data is output to the exclusive logical OR circuit 197.

Alternatively, the data after the error correction supplied from the output terminal SO of the block 22-1 may be returned to the original data registers FF3-FF0 through the selector circuit 46-1, and then the signal Sig2 is set at the supply voltage VDD to output the error-corrected data from error-correction circuit 43A-1.

In this way, the device according to this embodiment comprises plural e-fuse blocks with 7-bit data registers connected or layered in series. The code processing may be performed in parallel quickly. Moreover, the degree of integration may be changed simply with a change of the number of layered data-registers. This embodiment thus has a greater degree of freedom for extension. In addition, although this embodiment explained the example using the (7, 4) cyclic code, it is possible to adopt the same configuration to any codes with a longer code length.

Thus, although the invention has been described with respect to particular embodiments thereof, it is not limited to those embodiments. It will be understood that various modifications and additions and the like may be made without departing from the spirit of the present invention.

What is claimed is:

1. A non-volatile semiconductor storage device comprising:
   a memory cell array including a plurality of non-volatile semiconductor memory elements, each memory element storing data in a non-volatile manner;
   a shift register storing data read from the semiconductor memory element and sequentially transferring the data outside, the shift register also storing data transferred from outside and storing the data in the semiconductor memory element;
   a syndrome generation circuit connected to an output terminal of the shift register, the syndrome generation circuit generating syndrome of data output from the output terminal; and
   an error-correction circuit using the data and the syndrome to correct an error of the data;
   wherein the syndrome generation circuit inputs the output signal from the shift register in a syndrome generation period, and inhibits the input of the output signal in an error-correction period in the error-correction circuit.

2. The non-volatile semiconductor storage device according to claim 1, wherein
   the shift register has a portion receiving effective data transferred thereto, the effective data being read from the semiconductor memory element, and the shift register has another portion receiving redundancy data transferred thereto, the redundancy data being to correct an error of the effective data.

3. The non-volatile semiconductor storage device according to claim 1, further comprising a first selector circuit including a plurality of input terminals, the first selector circuit selecting one of the input terminals to select an input to the shift register, wherein
   the input terminal includes an input terminal that inputs an output signal from the shift register, thus shifting data in the shift register.

4. The non-volatile semiconductor storage device according to claim 1, further comprising a first selector circuit including a plurality of input terminals, the first selector circuit selecting one of the input terminals to select an input to the shift register, wherein
   the input terminal includes a first input terminal that inputs data to be written in the semiconductor memory element from outside, and a second input terminal that inputs an output signal from the shift register, thus shifting data in the shift register.

5. The non-volatile semiconductor storage device according to claim 1, wherein
   the syndrome generation circuit is switchable between a first mode where the syndrome is generated based on the effective data and the redundancy data, the effective and redundancy data being output from the output terminal of the shift register, and a second mode where the redundancy data is generated based on the effective data output from the output terminal of the shift register.

6. The non-volatile semiconductor storage device according to claim 1, further comprising a encode-control circuit
   receiving effective data transferred thereto, the effective data being read from the semiconductor memory element, and generates redundancy data for correcting an error of the effective data.

7. The non-volatile semiconductor storage device according to claim 1, wherein
   the shift register comprises a second selector circuit at a boundary between a data register that stores the effective data read from the semiconductor memory element and a data register that stores redundancy data for correcting an error of the effective data, and wherein
   the second selector circuit is able to selectively output only the effective data externally.

8. The non-volatile semiconductor storage device according to claim 7, further comprising a first selector circuit including a plurality of input terminals, the first selector circuit selecting one of the input terminals to select an input to the shift register, wherein
   the input terminal includes an input terminal that inputs an output signal from the shift register, thus shifting data in the shift register.

9. The non-volatile semiconductor storage device according to claim 7, further comprising a first selector circuit including a plurality of input terminals, the first selector circuit selecting one of the input terminals to select an input to the shift register, wherein
   the input terminal includes a first input terminal that inputs data to be written in the semiconductor memory element from outside, and a second input terminal that inputs an output signal from the shift register, thus shifting data in the shift register.

10. A non-volatile semiconductor storage device comprising:
    a memory cell array including a plurality of non-volatile semiconductor memory elements, each memory element storing data in a non-volatile manner;
    a shift register storing data read from the semiconductor memory element and sequentially transferring the data outside, the shift register also storing data transferred from outside and storing the data in the semiconductor memory element;
    a syndrome generation circuit connected to an output terminal of the shift register, the syndrome generation circuit generating syndrome of data output from the output terminal; and
    an error-correction circuit using the data and the syndrome to correct an error of the data, wherein the shift register includes m pieces of data registers connected in series to store m-bit data, and when the syndrome generation circuit generates the syndrome, the m-bit data is cycled in the shift register and is returned to the original data register.

11. The non-volatile semiconductor storage device according to claim 10, further comprising a first selector circuit including a plurality of input terminals, the first selector circuit selecting one of the input terminals to select an input to the shift register, wherein the input terminal includes an input terminal that inputs an output signal from the shift register, thus shifting data in the shift register.

12. The non-volatile semiconductor storage device according to claim 10, further comprising a first selector circuit including a plurality of input terminals, the first selector circuit selecting one of the input terminals to select an input to the shift register, wherein the input terminal includes a first input terminal that inputs data to be written in the semiconductor memory element from outside, and a second input terminal that inputs an output signal from the shift register, thus shifting data in the shift register.

13. A non-volatile semiconductor storage device comprising:

a memory cell array including a plurality of non-volatile semiconductor memory elements, each memory element storing data in a non-volatile manner;

a shift register storing data read from the semiconductor memory element and sequentially transferring the data outside, the shift register also storing data transferred from outside and storing the data in the semiconductor memory element;

a syndrome generation circuit comprising an exclusive logic OR circuit to generate syndrome of data stored in the shift register; and an error-correction circuit using the data and the syndrome to correct an error of the data;

wherein the syndrome generation circuit inputs the output signal from the shift register in a syndrome generation period, and inhibits the input of the output signal in an error-correction period in the error-correction circuit;

wherein the shift register, the syndrome generation circuit, and the error-correction circuit are connected in series in a block, and a plurality of the blocks are connected in series.

* * * * *